(12) United States Patent
Jiang et al.

(10) Patent No.: US 9,502,265 B1
(45) Date of Patent: Nov. 22, 2016

(54) VERTICAL GATE ALL AROUND (VGAA) TRANSISTORS AND METHODS OF FORMING THE SAME

(71) Applicant: Taiwan Semiconductor Manufacturing Company, Ltd., Hsin-Chu (TW)

(72) Inventors: Ching-Hong Jiang, Hsin-Chu (TW); Li-Ting Wang, Hsin-Chu (TW); Teng-Chun Tsai, Hsin-Chu (TW); Shih-Chiang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/932,777

(22) Filed: Nov. 4, 2015

(51) Int. Cl.
| | | |
|---|---|---|
| *H01L 21/302* | (2006.01) | |
| *H01L 21/461* | (2006.01) | |
| *H01L 21/3115* | (2006.01) | |
| *H01L 21/3105* | (2006.01) | |
| *H01L 29/66* | (2006.01) | |
| *H01L 29/423* | (2006.01) | |

(52) U.S. Cl.
CPC ... *H01L 21/31155* (2013.01); *H01L 21/31053* (2013.01); *H01L 21/31055* (2013.01); *H01L 29/42392* (2013.01); *H01L 29/66795* (2013.01)

(58) Field of Classification Search
CPC ........... H01L 21/0228; H01L 21/3105; H01L 21/02241; H01L 21/02642; H01L 21/045; H01L 21/28079; H01L 21/76264; H01L 21/28294; H01L 21/31055; H01L 21/31053; H01L 21/31155; H01L 29/42392; H01L 29/66795; H01L 29/7816; H01L 29/7833
USPC ....... 438/692, 775, 740, 712, 311, 680, 679, 438/780, 770, 786, 791; 257/E21.006, 257/E21.007, E21.041, E21.126, E21.127, 257/E21.157, E21.17, E21.218, E21.304, 257/E21.229, E21.267, E21.278, E21.293, 257/E21.32, E21.441
See application file for complete search history.

(56) References Cited

U.S. PATENT DOCUMENTS

| | | | | |
|---|---|---|---|---|
| 7,888,764 | B2 * | 2/2011 | Lee .................. | H01L 21/76256 257/461 |
| 8,273,610 | B2 * | 9/2012 | Or-Bach .................. | G11C 8/16 438/142 |
| 9,136,153 | B2 * | 9/2015 | Or-Bach ............. | H01L 21/6835 |

* cited by examiner

*Primary Examiner* — David Nhu
(74) *Attorney, Agent, or Firm* — Slater Matsil, LLP

(57) ABSTRACT

An embodiment method includes forming a nanowire extending upwards from a substrate, wherein the nanowire includes: a bottom semiconductor region; a middle semiconductor region over the bottom semiconductor region; and a top semiconductor region over the middle semiconductor region. The method also includes forming a dielectric layer around and extending over the nanowire and forming a chemical mechanical polish-stop (CMP-stop) layer within the dielectric layer using an implantation process. After forming the CMP-stop layer, the dielectric layer is planarized.

20 Claims, 28 Drawing Sheets

VERTICAL GATE ALL AROUND (VGAA) TRANSISTORS AND METHODS OF FORMING THE SAME

BACKGROUND

As the semiconductor industry has progressed into nanometer technology nodes in pursuit of higher device density, higher performance, and lower costs, challenges from both fabrication and design issues have resulted in the development of three-dimensional designs, such as a vertical gate all around (VGAA) transistor. A typical VGAA transistor enables enhanced control of the charge carriers along the lengthwise direction through a complete encirclement of the channel region of a semiconductor nanowire by a gate dielectric and a gate electrode. The VGAA transistor has a reduced short channel effect because the channel region may be surrounded by the gate electrode so that an effect of the source/drain region on an electric field of the channel region may be reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
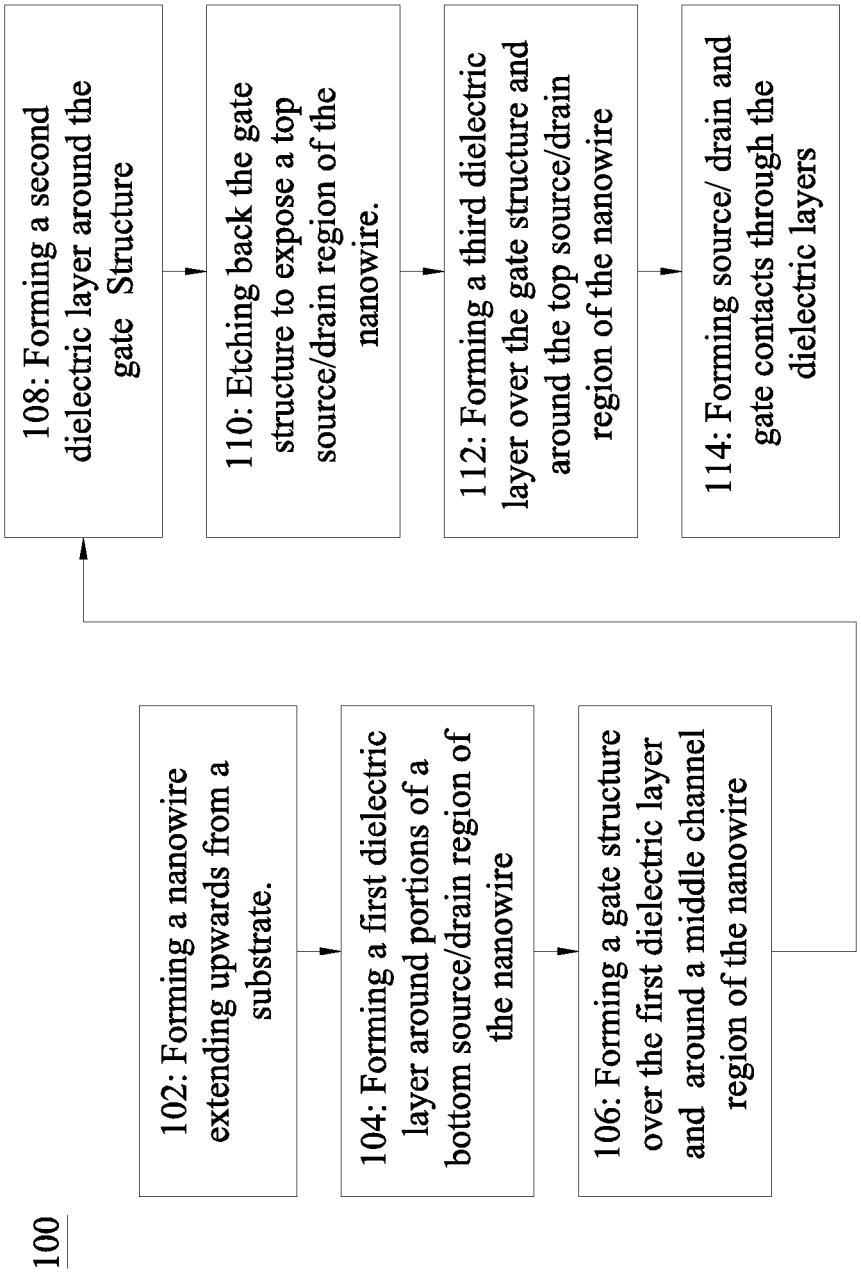
FIG. 1 illustrates a process flow for forming a VGAA transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a vertical gate all around (VGAA) transistor and methods of forming the same. The VGAA transistor includes one or more nanowires extending upwards from a semiconductor substrate. The nanowires each include a bottom source/drain region, a middle channel region over the bottom source/drain region, and a top source/drain region over the channel region. A gate structure is disposed around and encircles the channel regions of one or more nanowires while dielectric layers surround the top and bottom source/drain regions of the one or more nanowires. In various embodiments, impurities are implanted into the dielectric layers during formation of the VGAA transistor in order to form various etch stop and/or chemical mechanical polish (CMP) stop layers within the dielectric layers. Thus, improved process control for forming the dielectric layers and the gate structure can be achieved.

FIG. 1 illustrates a process flow 100 for forming a VGAA transistor in accordance with various embodiments. In step 102, a nanowire is formed extending upwards from a semiconductor substrate. The nanowire may include a bottom source/drain region, which extends into a top surface of the semiconductor substrate; a middle channel region over the bottom source/drain region, and a top source/drain region over the middle channel region. Additional features, such as silicide regions extending into the top and bottom source/drain regions may also be formed. Process flow 100 continues in step 104, where a first dielectric layer is formed over the semiconductor substrate around regions of the bottom source/drain region of the nanowire. The first dielectric layer may be initially formed over a top surface of the nanowire, and various CMP and/or etch back processes may be applied so that a top surface of the first dielectric layer is substantially level with a top surface of the bottom source/drain region. In various embodiments one or more etch stop and/or CMP stop layers may be formed within the first dielectric layer by implanting impurities to provide better process control for CMP and etch back processes as will be described in greater detail below.

Next in step 106, a gate structure is formed over the first dielectric layer around the middle channel region of the nanowire. The gate structure may include various interfacial, gate dielectric, work function metal, and gate electrode layers, for example, and the gate structure may be initially formed over a top surface and on sidewalls of the nanowire. Because of the first dielectric layer, the gate structure is not formed around the bottom source/drain region.

Process flow 100 then continues to step 108 where a second dielectric layer is formed around the gate stack. The second dielectric layer may be initially formed over a top surface of the nanowire/gate stack, and various CMP and/or etch back processes may be applied so that a top surface of the second dielectric layer is substantially level with a top surface of the middle channel region. In various embodiments one or more etch stop and/or CMP stop layers may be formed within the second dielectric layer by implanting impurities, which provides better process control for CMP and etch back processes as will be described in greater detail below.

Next in step 110, a region of the gate stack extending over the second dielectric layer is removed to expose the top source/drain region. In step 112, a third dielectric layer is formed over the gate stack and around the top source/drain region of the nanowire. In step 114, source/drain contacts and gate contacts are formed extending through various dielectric layers to electrically connect to the top source drain region, the bottom source/drain region, and the middle channel region. Thus, through the various process steps described above, a gate stack may be formed around a channel region of a nanowire while dielectric layers are formed around top and bottom source/drain regions.

Figure 2:
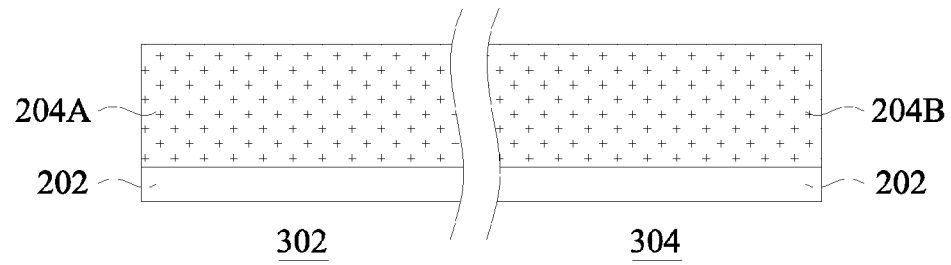
FIGS. 2 through 7, 8A, 8B, 9A, 9B, 9C, 10, 11A, 11B, 12A, 12B, 13 through 15, 16A, 16B, 17A, 17B, 17C, 18, 19A, 19B, 20A, 20B, and 21 through 27 illustrate cross-sectional views of various intermediary stages of manufacturing a VGAA transistor in accordance with some embodiments.

FIGS. 2 through 5 are cross-sectional views of a semiconductor device 200 at various stages of fabrication according to embodiments of process flow 100 of FIG. 1. Specifically, FIGS. 2 through 5 illustrate intermediary stages of forming nanowires extending upwards from a substrate according to step 102 of process flow 100. Referring first to FIG. 2, a semiconductor device 200 having a substrate 202 is illustrated. Substrate 202 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the base substrate layer may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Substrate 202 includes a device region 302 for forming p-type devices and a device region 304 for forming n-type devices. Device regions 302 and 304 may or may not be contiguous and any number of device features (e.g., isolation regions, dummy features, or the like, not shown) may be formed between device region 302 and device region 304 depending on device design. In device region 302, substrate 202 includes an n-well 204A for forming p-type devices while, in device region 304, substrate 202 includes a p-well 204B for forming n-type devices. N-well 204A and p-well 204B may be formed, for example, by implanting dopants of an appropriate type and concentration into substrate 202. During implantation, regions of substrate 202 may be masked to form well regions 204A and 204B of different types in an upper surface of substrate 202.

Figure 3:
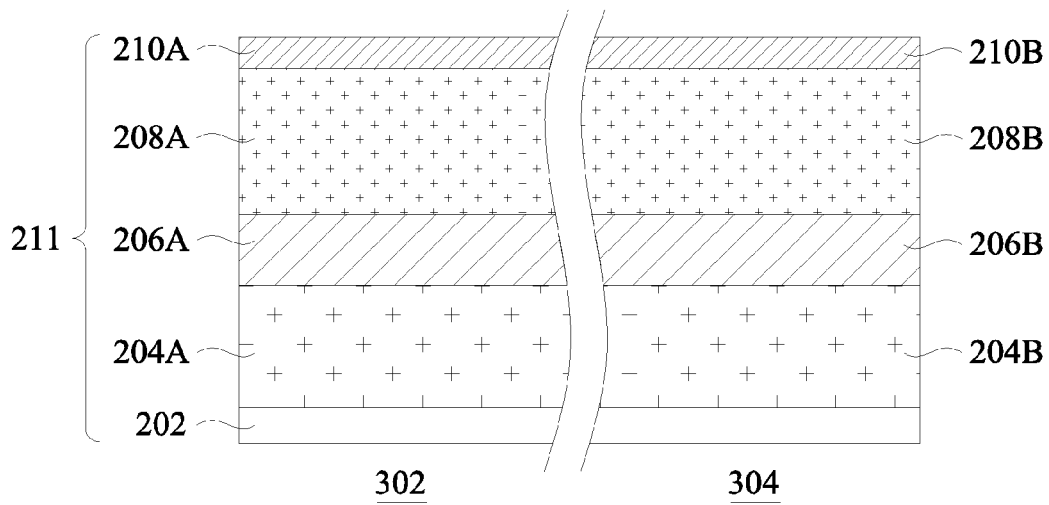
Figure 4:
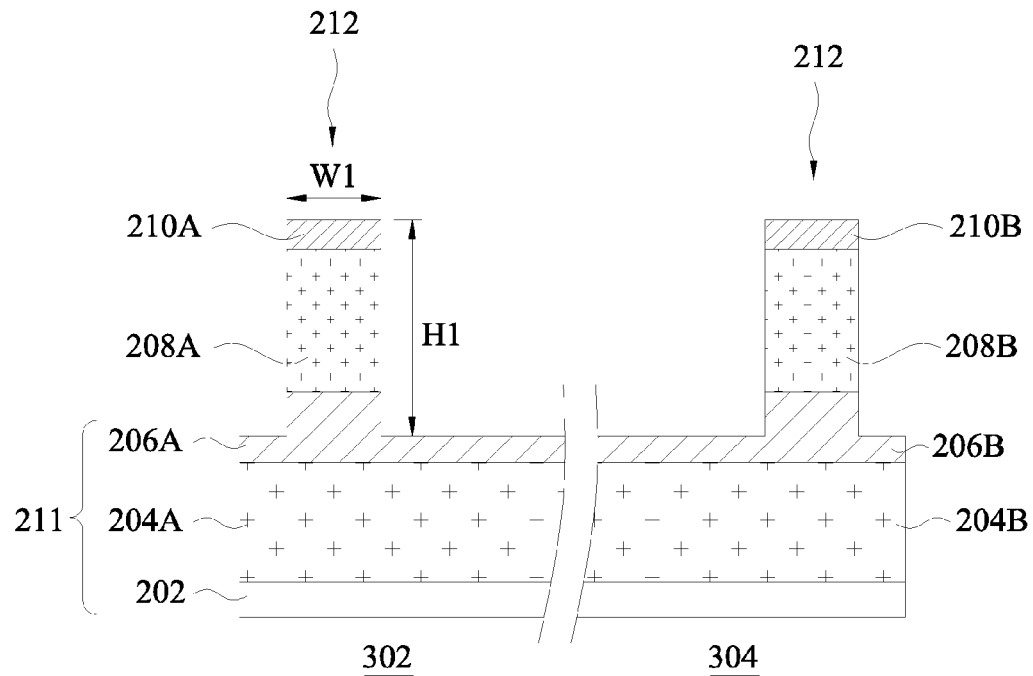

Referring next to FIG. 3, various semiconductor layers are formed over well regions 204A and 204B to form a multi-layered substrate 211. Each semiconductor layer may be formed using an epitaxy process, such as metal-organic (MO) chemical vapor deposition (CVD), molecular beam epitaxy (MBE), liquid phase epitaxy (LPE), vapor phase epitaxy (VPE), selective epitaxial growth (SEG), combinations thereof, and the like. Multilayered substrate 211 include a bottom semiconductor layer having semiconductor regions 206A and 206B disposed over well regions 204A and 204B; a middle semiconductor layer having semiconductor regions 208A and 208B disposed over semiconductor regions 206A and 206B; and a top semiconductor layer having semiconductor regions 210A and 210B disposed over semiconductor regions 208A and 208B.

Top and bottom semiconductor regions 206A and 210A in device region 302 may be doped with a p-type dopant (e.g., B, BF$_2$, Si, Ge, C, Zn, Cd, Be, Mg, In, combinations thereof, and the like) at a suitable concentration (e.g, about $1\times10^{18}$ atoms/cm$^2$ to about $1\times10^{22}$ atoms/cm$^2$). Suitable epitaxy materials for semiconductor regions 206A and 210A (e.g., p-type epitaxy materials) may include Si, SiGe, SiGeB, Ge, GeB, a III-V material (e.g., InSb, GaSb, InGaSb, and the like), combinations thereof, and the like. In other embodiments, semiconductor regions 206A and 210A may comprise a different material, different dopants, and/or a different doping concentration depending on device design.

Top and bottom semiconductor regions 206B and 210B in device region 304 may be doped with a n-type dopant (e.g., P, As, Si, Ge, C, O, S, Se, Te, Sb, combinations thereof, and the like) at a suitable concentration (e.g, about $1\times10^{18}$ atoms cm$^{-3}$ to about $1\times10^{22}$ atoms cm$^{-3}$). Suitable materials for semiconductor regions 206B and 210B (e.g., n-type epitaxy materials) may include Si, SiP, SiPC, Ge, GeP, a III-V material (e.g., InP, GaAs, AlAs, InAs, InAlAs, InGaAs, and the like), combinations thereof, and the like. In other embodiments, semiconductor regions 206B and 210B may comprise a different material, different dopants, and/or a different doping concentration depending on device design.

Middle semiconductor region 208A in device region 302 and middle semiconductor region 208B in device region 304 may be doped with either n-type or p-type dopants depending on device design. For example, for accumulation mode devices, semiconductor region 208A may be doped with p-type dopants (e.g., B, BF$_2$, Si, Ge, C, Zn, Cd, Be, Mg, In, combinations thereof, and the like) while semiconductor region 208B may be doped with n-type dopants (e.g., P, As, Si, Ge, C, O, S, Se, Te, Sb, combinations thereof, and the like). As another example, for inversion mode devices, semiconductor layer 208A may be doped with n-type dopants (e.g., P, As, Si, Ge, C, O, S, Se, Te, Sb, combinations thereof, and the like) while semiconductor layer 208B may be doped with p-type dopants (e.g., B, BF$_2$, Si, Ge, C, Zn, Cd, Be, Mg, In, combinations thereof, and the like). In an embodiment, a dopant concentration of semiconductor regions 208A and 208B may be about $1\times10^{12}$ atoms cm$^{-3}$ to about $1\times10^{18}$ atoms cm$^{-3}$, for example. Suitable materials for semiconductor regions 208A and 208B may include Si, SiP, SiPC, SiGe, SiGeB, Ge, GeB, GeP, a III-V material (e.g., InP, GaAs, AlAs, InAs, InAlAs, InGaAs, InSb, GaSb, InGaSb, and the like), combinations thereof, and the like. The material of semiconductor region 208A and/or 208B may depend on the desired type the respective region. In other embodiments, semiconductor regions 208A and 208B may comprise a different material, different dopants, and/or a different doping concentration depending on device design.

In FIG. 3, multilayered substrate 211 is patterned to form nanowire 212A in device region 302 and nanowire 212B in device region 304. The patterning of multilayered substrate 211 may be done using a combination of photolithography and etching. For example, a hard mask and/or photoresist (not illustrated) may be disposed over multilayered substrate 211. The hard mask may comprise one or more oxide (e.g., silicon oxide) and/or nitride (e.g., silicon nitride) layers to prevent damage to the underlying semiconductor layers during patterning, and the hard mask may be formed using any suitable deposition process, such as, atomic layer deposition (ALD), CVD, high density plasma CVD (HDP-CVD), physical vapor deposition (PVD), and the like. The photoresist may comprise any suitable photosensitive material blanket deposited using a suitable process, such as, spin on coating, and the like.

To pattern the various semiconductor regions, the photoresist may first be patterned by exposing the photoresist (e.g., by exposure to light) using a photomask. Exposed or unexposed portions of the photoresist may then be removed depending on whether a positive or negative resist is used. The pattern of the photoresist may then be transferred to the hard mask (e.g., using a suitable etching process). Subsequently, semiconductor regions 206A, 206B, 208A, 208B, 210A, and 210B are etched using the hard mask as a patterning mask during an etching process, for example. The etching of multilayered substrate 211 may include acceptable etch processes, such as a reactive ion etch (RIE), neutral beam etch (NBE), the like, or a combination thereof. The etching may be anisotropic. Subsequently, any remaining portions of photoresist is removed in an ashing and/or wet strip processes, for example. The hard mask may also be removed.

In some embodiments, nanowires 212A and 212B each has a width W1 of about 1 nm to about 20 nm and a height H1 of about 100 Å to about 2000 Å, for example. In other embodiments, nanowires 212A and 212B may have different dimensions. Each nanowire 212A and 212B includes a top highly-doped semiconductor region 210A/210B, a middle lightly-doped (or even undoped) semiconductor region 208A/208B, and a bottom highly-doped semiconductor region 206A/206B. In the completed VGAA transistors (see e.g., FIG. 27), semiconductor regions 206A/206B are bottom source/drain regions, semiconductor regions 208A/208B are channel regions, and semiconductor region 210A/210B are top source/drain regions. Although only one nanowire 212A or 212B are illustrated in each device region 302 and 304, any number of nanowires may be formed for each VGAA transistor. In an embodiment, a single VGAA transistor may include a single gate stack surrounding a plurality of nanowires (sometimes referred to as a forest of nanowires). Furthermore, semiconductor regions 206A/206B may extend into an upper region of underlying multilayered substrate 211 and extend laterally past edges of nanowires 212A and 212B.

Figure 5:
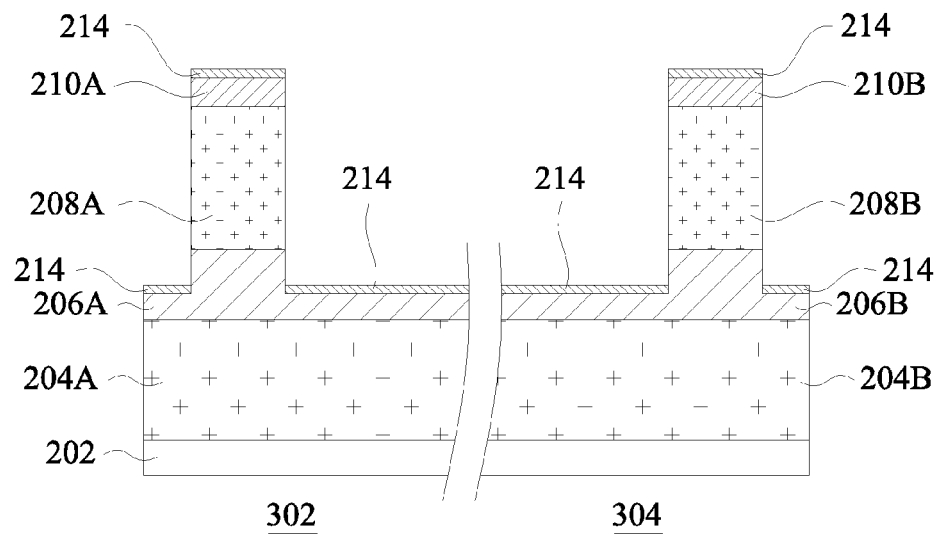

FIG. 5 illustrates the formation of self-aligned silicide (salicide) regions 214 in upper exposed surfaces of semiconductor regions 206A, 206B, 210A, and 210B. In an embodiment, salicide regions 214 are formed by first depositing a conductive film (not illustrated) on exposed, top surfaces of semiconductor regions 206A, 206B, 210A, and 210B. In some embodiments, the conductive film comprises a metal, such as titanium, nickel, platinum, cobalt, combinations thereof, and the like, for example. After depositing the conductive film, an annealing process may be performed to cause the diffusion of the material of conductive film into semiconductor regions 206A, 206B, 210A, and 210B. For example, an annealing process may be performed at a temperature of about 100° C. to about 900° C. using argon (Ar) or nitrogen ($N_2$) as a process gas under an atmospheric pressure of about 770 Torr to about 850 Torr. The annealing forms salicide regions 214 at upper surfaces of semiconductor regions 206A, 206B, 210A, and 210B. Salicide regions 214 may include a combination of the semiconductor material of semiconductor regions 206A, 206B, 210A, and 210B and the conductive material of the conductive film.

Figure 6:
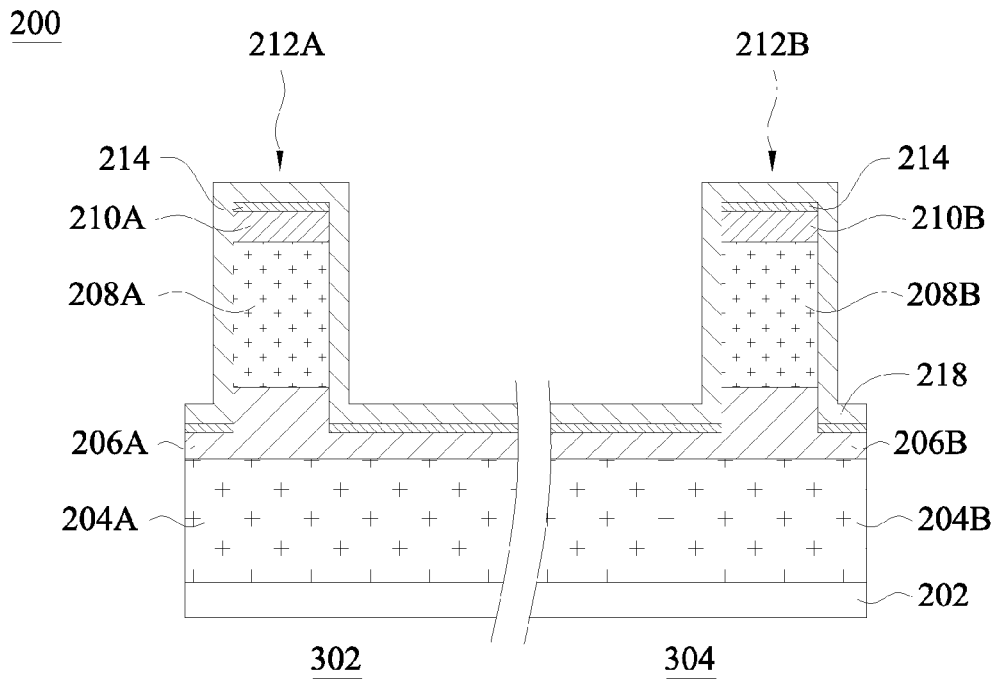

FIGS. 6 through 12B are cross-sectional views of semiconductor device 200 at various stages of fabrication according to embodiments of process flow 100 of FIG. 1. Specifically, FIGS. 6 through 12B illustrate intermediary stages of forming a first dielectric layer (e.g., dielectric layer 216, see FIG. 10) around a bottom source/drain region (e.g., semiconductor regions 206A/206B) of a nanowire (e.g., nanowires 212A/212B) according to step 104 of process flow 100. Referring first to FIG. 6, a contact etch stop layer (CESL) 218 is deposited over a top surface and sidewalls of nanowires 212A and 212B. CESL 218 may further be deposited over a top surface of multilayered substrate 211. In some embodiments, CESL 218 comprises a material that can be selectively etched from a material of the subsequently formed dielectric layer 216 (see FIG. 7). For example, in an embodiment where dielectric layer 216 (see FIG. 7) comprises an oxide, CESL 218 may comprise SiN, SiC, SiCN, and the like. CESL 218 may be deposited using a conformal process, such as CVD, plasma enhanced CVD, PECVD, PVD, and the like.

Figure 7:
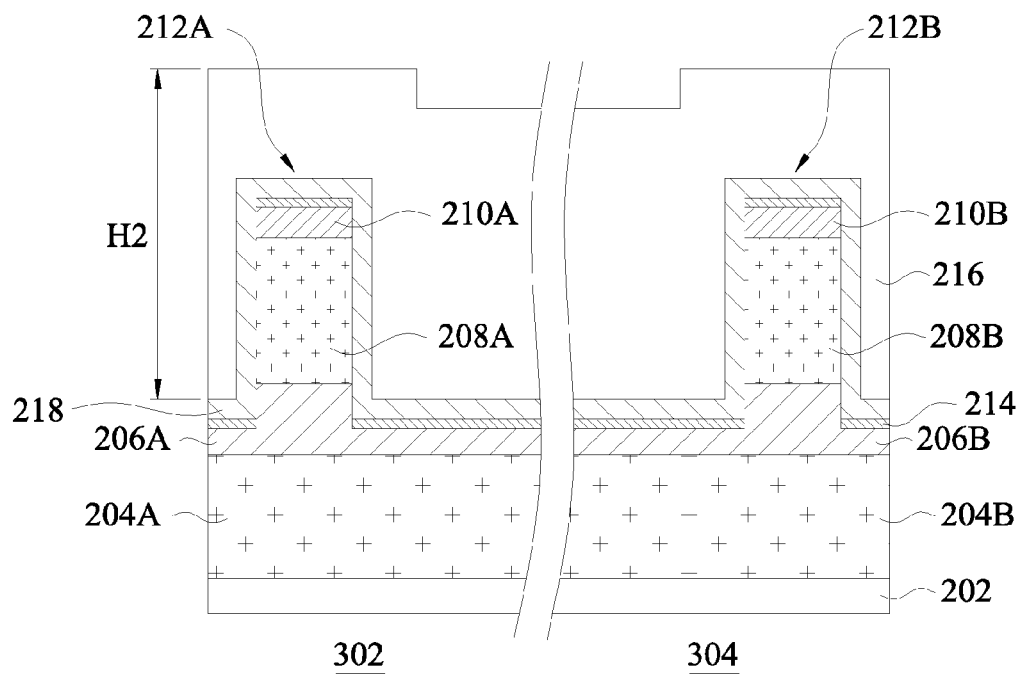

Next, in FIG. 7, dielectric layer 216 is formed over CESL 218. Dielectric layer 216 may comprise a low-k dielectric having a k-value less than about 3.9, such as about 2.8 or even less. In some embodiments, dielectric layer 216 comprises a flowable oxide formed using, for example, flowable chemical vapor deposition (FCVD). Dielectric layer 216 may fill the space between adjacent nanowires (e.g., nanowires 212A/212B in FIG. 7), and dielectric layer 216 may further extend above and cover top surfaces of CESL 218 and nanowires 212A/212B. In some embodiments, dielectric layer 216 has a height H2 of about 150 nm to about 180 nm, for example. Because dielectric layer 216 is deposited on a non-planar surface (e.g., due to nanowires 212A/212B), a top surface of dielectric layer 216 may also be non-planar. For example, a portion of dielectric layer 216 directly over nanowires 212A/212B may be higher than other portions of dielectric layer 216. Furthermore, due to process limitations, heights of various nanowires (e.g., nanowires 212A/212B) may vary throughout device 200. For example, a height variance between nanowires in device 200 may be about 10 nm or greater. Thus, a top surface of dielectric layer 216 may also vary in height throughout device 200.

Figure 8A:
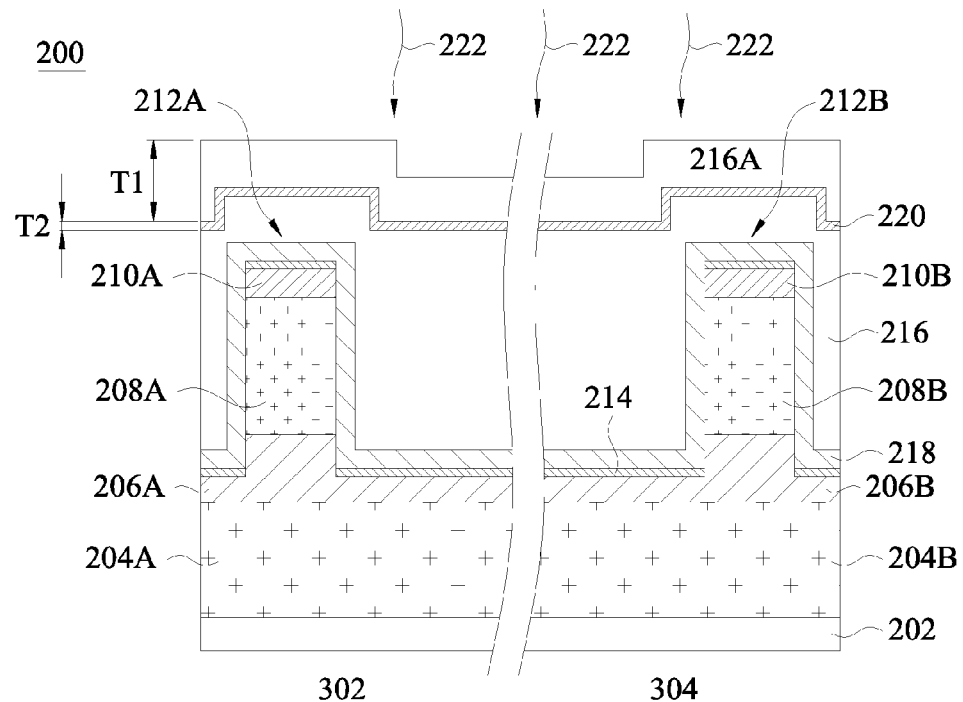
Figure 8B:
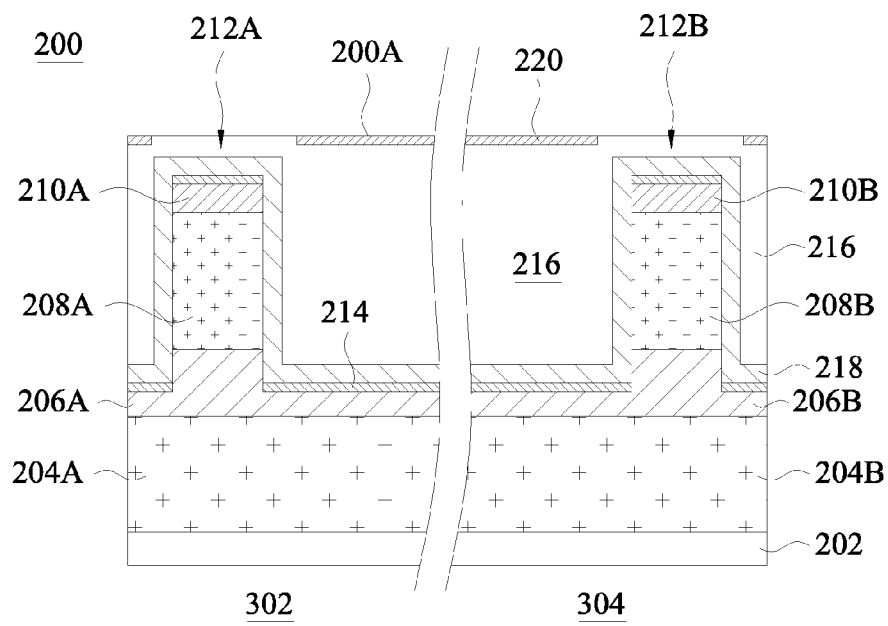

After dielectric layer 216 is deposited, a planarization process is applied to a top surface of dielectric layer 216. For example, FIGS. 8A and 8B illustrate planarizing dielectric layer 216 according in an embodiment. In FIG. 8A, a CMP-stop layer 220 is formed within and beneath a top surface of dielectric layer 216 using an implantation process as indicated by arrows 222. In an embodiment, suitable impurities (e.g., Si, C, N, Ge, As, Ar, combinations thereof, and the like) are implanted within dielectric layer 216 at a suitable concentration (e.g., $1 \times 10^{13}$ atoms/cm² to about $1 \times 10^{16}$ atoms/cm²).

As a result of the implantation process, a portion of dielectric layer 216 having such impurities is transformed into CMP-stop layer 220. It has been observed by implanting impurities of the above type and concentration, CMP-stop layer 220 may be formed to have a lower CMP polishing rate than un-implanted portions of dielectric layer 216. For example, it has been observed that when germanium (Ge) is implanted in at a concentration of about $5 \times 10^{15}$ atoms/cm², a polishing rate of CMP-stop layer 220 is about 5 Å/s whereas un-implanted portions of dielectric layer 216 have a polishing rate of about 23.66 Å/s. As another example, when carbon (C) is implanted in at a concentration of about $5 \times 10^{15}$ atoms/cm², a polishing rate of CMP-stop layer 220 is about 4.8 Å/s.

After implantation, a portion of dielectric layer 216 (labeled 216A) may remain undoped (or less doped) over CMP-stop layer 220. For example, portion 216A may be substantially free of (or at least have a lower concentration of) the impurities implanted in CMP-stop layer 220. For example, in an embodiment, the impurity concentration of portion 216A is about $1 \times 10^{12}$ atoms/cm³ or less, which may not be sufficient for portion 216A to act as a CMP-stop layer or an etch-stop layer. In an embodiment, portion 216A of dielectric layer 216 may have a thickness of about 10 nm to about 30 nm, for example. Furthermore, CMP-stop layer 220 may have a thickness of about 3 nm to about 7 nm, for example.

Process conditions during implantation (e.g., implantation energy) may be controlled in order to form CMP-stop layer 220 at an appropriate position (e.g., depth) and thickness within dielectric layer 216. For example, implantation energy for forming CMP-stop layer 220 may be about 0.1 KeV to about 350 KeV in an embodiment. Because the top-surface of dielectric layer 216 is non-planar, CMP-stop layer 220 may also be non-planar. For example, a portion of CMP-stop layer 220 directly over nanowires 212A/212B may be higher than other portions of CMP-stop layer 220. Other embodiments may include forming CMP-stop layer 220 having different impurities, at different implantation concentration, at different implantation energies, and the like depending on process design.

Figure 28:
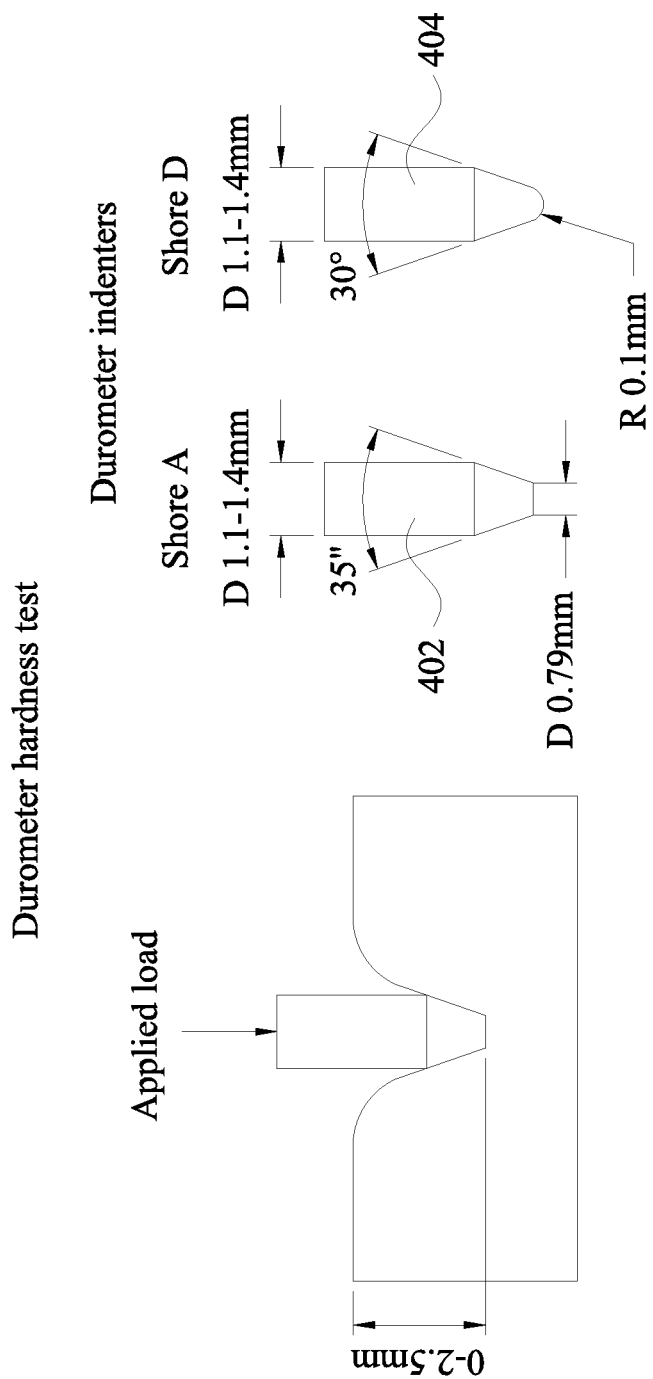
FIG. 28 illustrates example indenters for durometer hardness measurements in accordance with some embodiments.
Figure 24:
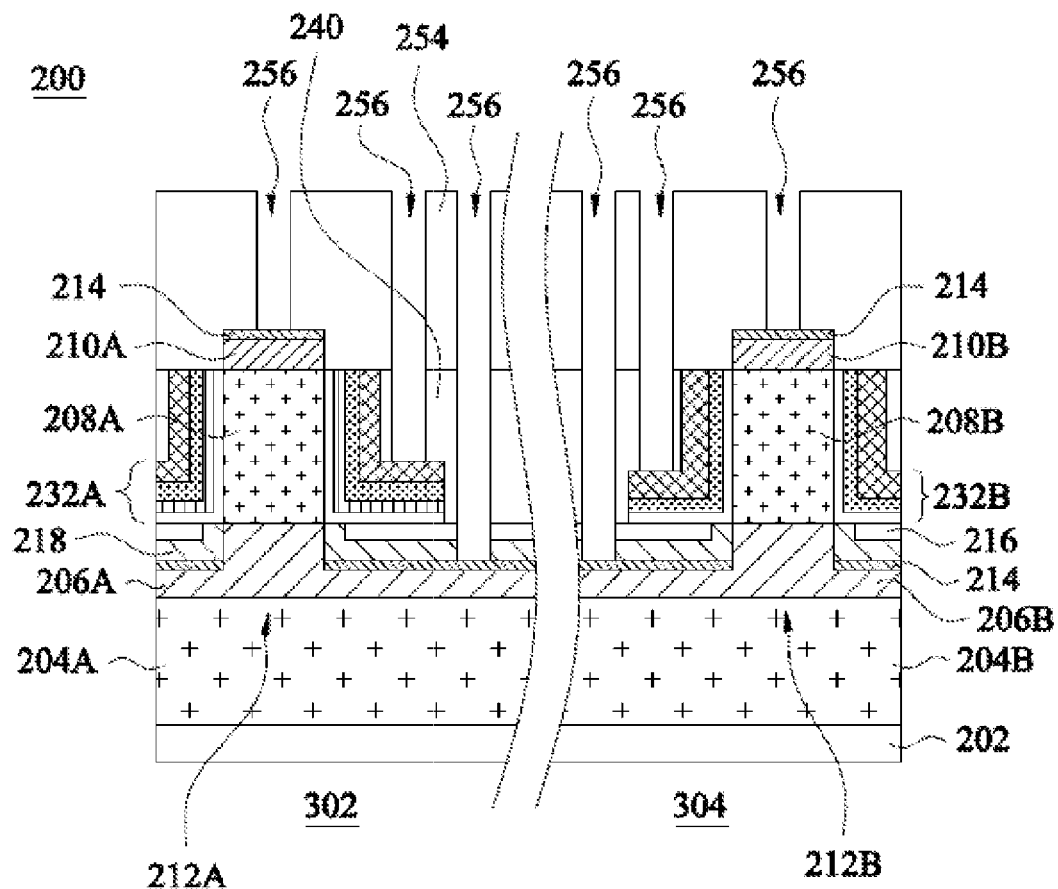
Figure 25:
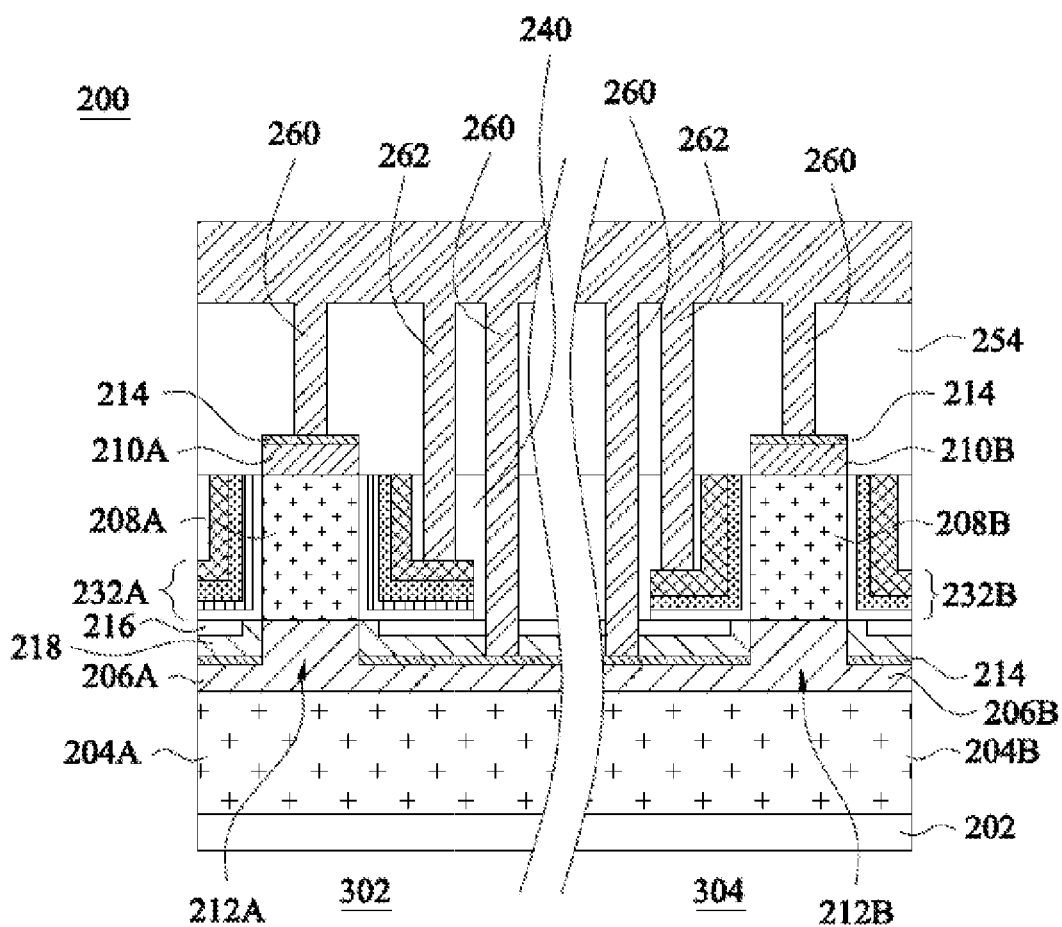
Figure 26:
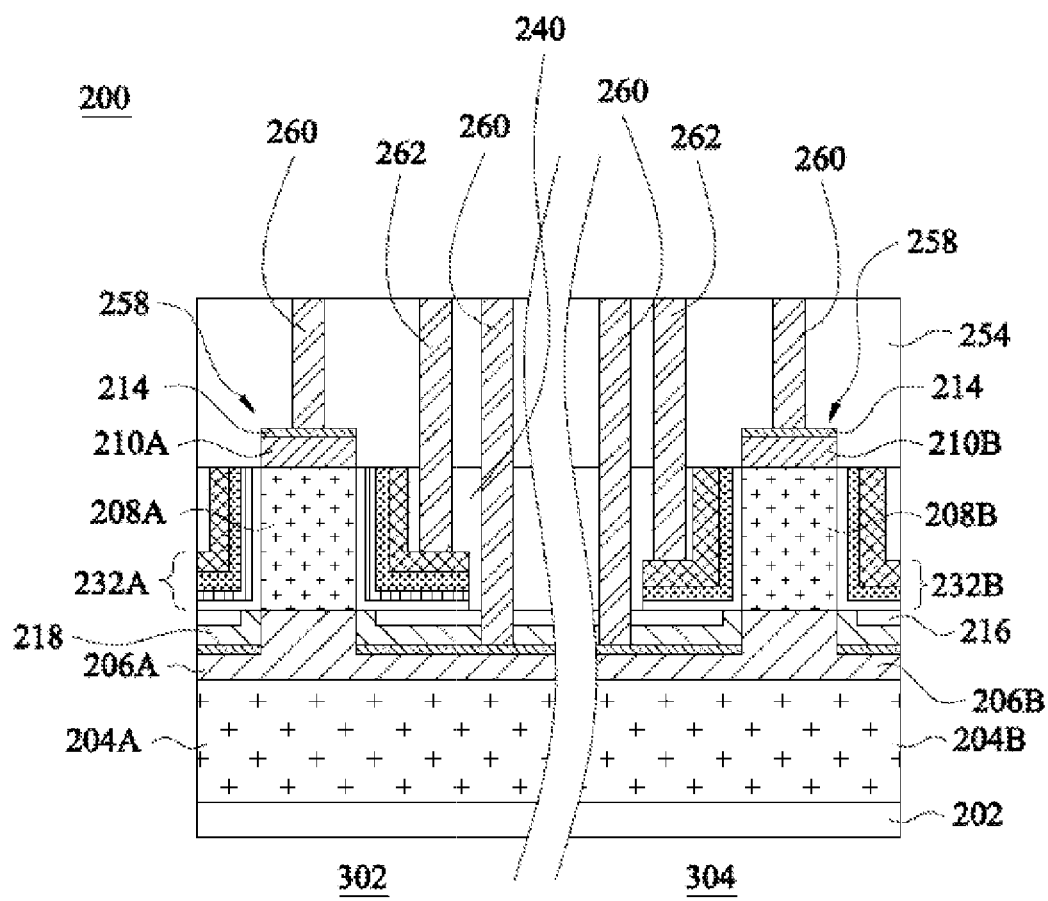
Figure 27:
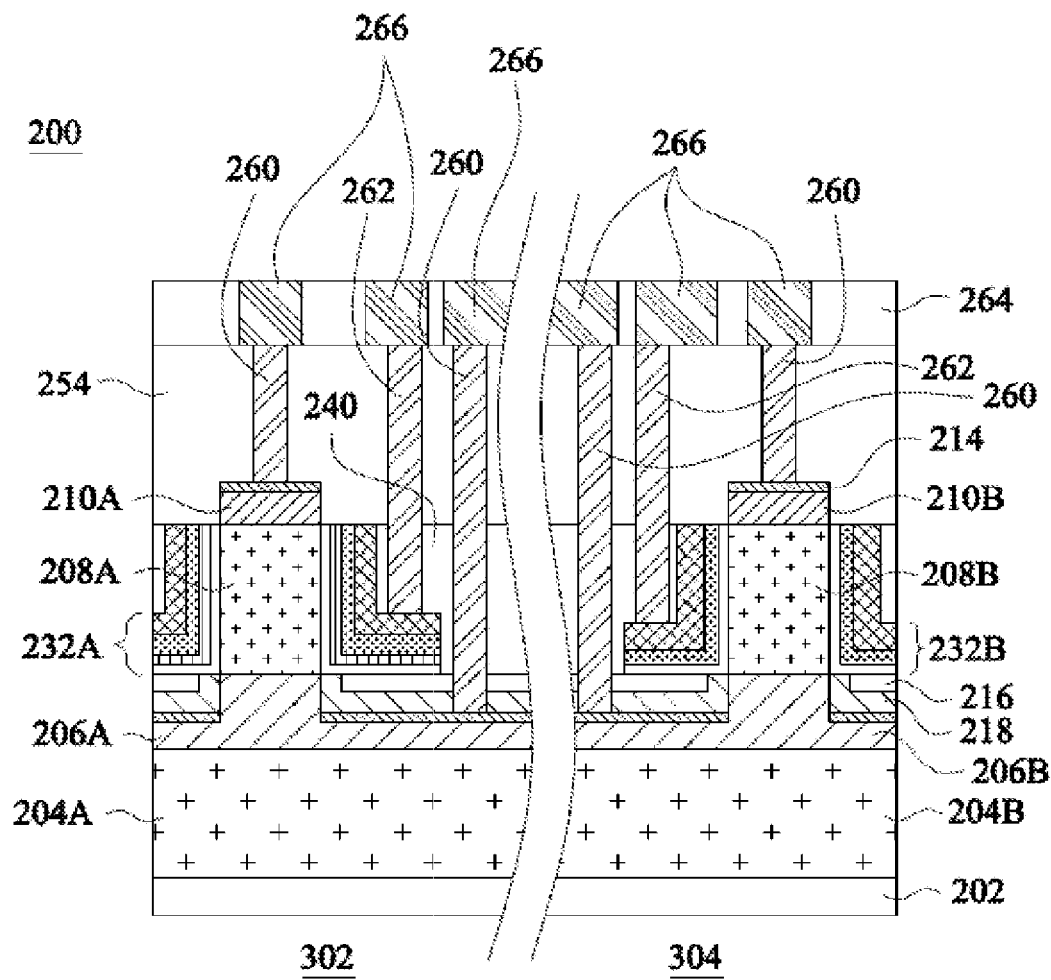

Next in FIG. 8B, portion 216A of dielectric layer 216 is removed using a suitable planarization process, such as CMP. In an embodiment, the process conditions during CMP may include applying a CMP down force of about 0.5 psi to about 3 psi; applying a CMP table speed of about 30 rpm to about 110 rpm; applying colloidal $SiO_2$, $Al_2O_3$, or $CeO_2$ based CMP slurries; applying a CMP slurry flow rate of about 50 ml/min to about 500 ml/min; applying a CMP polishing pad having a hardness of about Shore A 10 to about Shore D 70; combinations thereof; or the like. Other CMP process conditions may be applied in other embodiments. Shore hardness is a measure of the resistance of a material to penetration of a spring loaded needle-like indenter (sometimes known as a durometer). Hardness of polymers (rubbers, plastics) may be measured by Shore scales. Shore A scale is used for testing soft elastomers (e.g., rubbers) and other soft polymers. Hardness of hard elastomers and most other polymer materials may be measured by Shore D scale. Different indenter shapes (e.g., see FIG. 28 showing Shore A indenter 402 and Shore D indenter 404) and different spring loads may be used for different Shore scales (e.g., A and D). For example, the loading force of Shore A may be about 822 g, and the loading force of Shore D may me about 4536 g. Shore hardness values may vary in range from 0 to 100 with a maximum hardness value of 100 corresponding to zero penetration.

As discussed above, CMP-stop layer 220 is polished at a lower rate than dielectric layer 216 due to the implantation of impurities in CMP-stop layer 220. Thus, CMP-stop layer 220 acts a stopping layer during the CMP process, which improves the planarity of a top surface 200A of device 200 after CMP. Including CMP-stop layer 220 also allows improved control for reducing dielectric layer 216 to a target height for improved process control. For example, CMP-stop layer 220 may be formed at a position within dielectric layer 216 so that, after the second CMP process, a remaining portion of dielectric layer 216 is at a target height. In an embodiment, a position and thickness of CMP-stop layer 220 is selected in accordance with a desired target height for dielectric layer 216 after CMP. Furthermore, in various embodiments CMP-stop layer 220 may be formed above top surfaces of nanowires 212A/212B. Thus, the CMP process described above does not expose or damage nanowires 212A/212B.

Figure 9A:
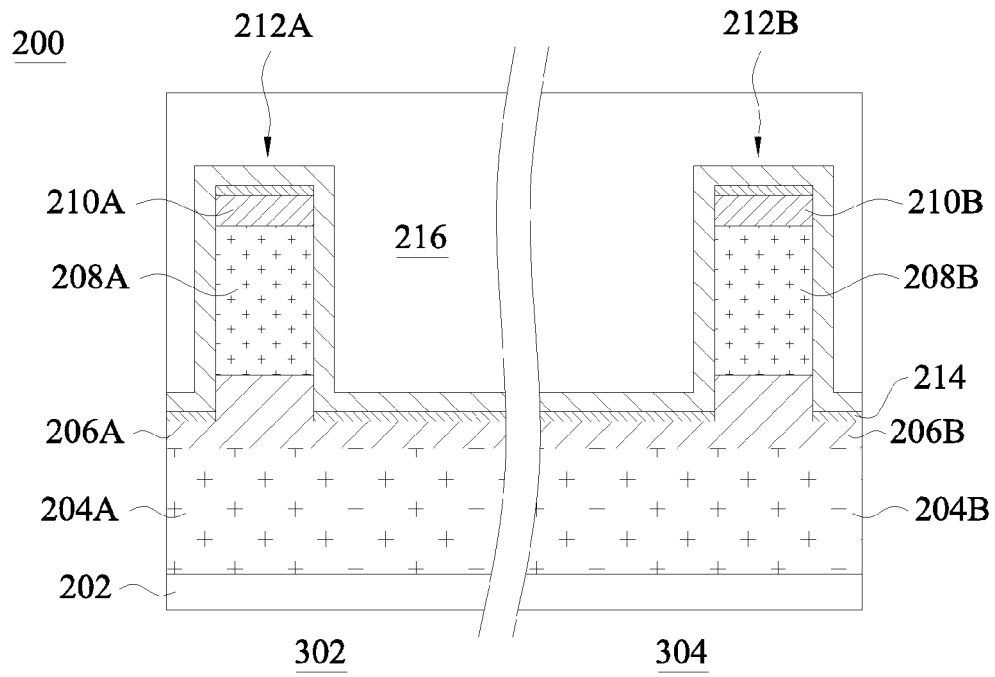
Figure 9B:
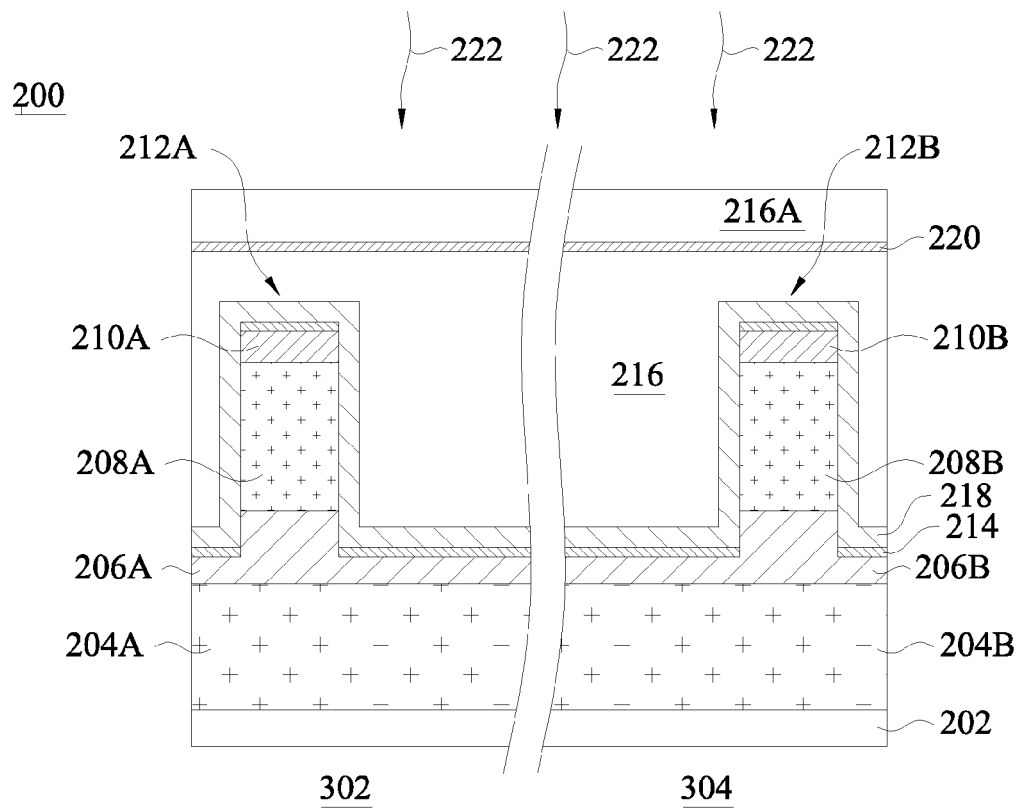
Figure 9C:
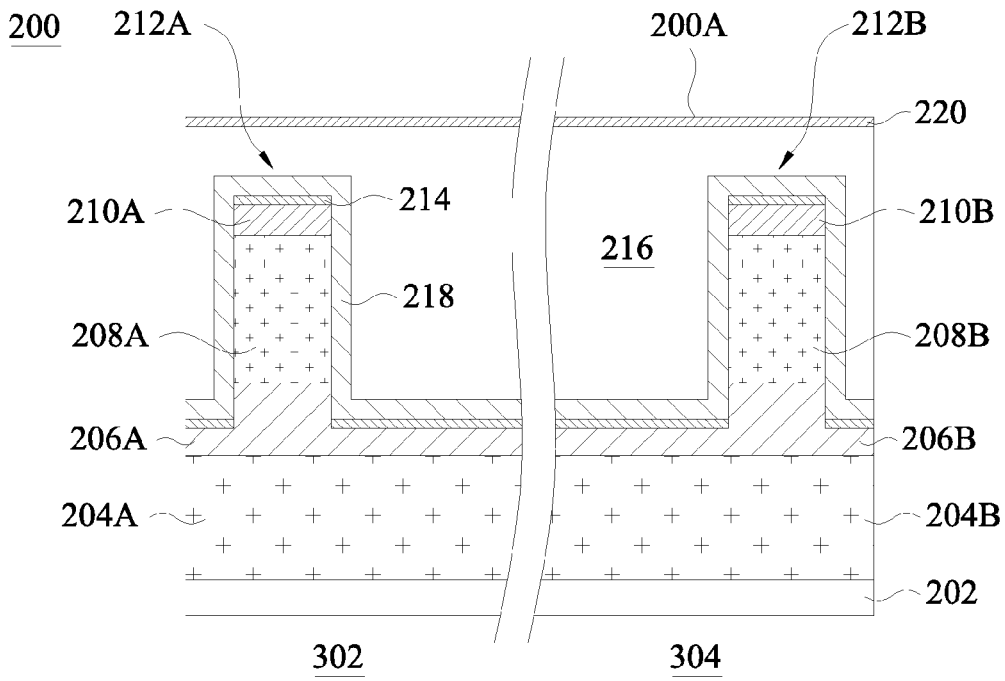

FIGS. 9A through 9C illustrate various intermediary steps of planarizing dielectric layer 216 according to another embodiment. In FIG. 9A, after dielectric layer 216 is deposited, a top surface of dielectric layer 216 may be planarized prior to forming CMP-stop layer 220. For example, a first CMP process similar to that described above may be applied to dielectric layer 216 prior to forming CMP-stop layer 220. An upper portion of dielectric layer 216 may be removed, and a top surface of dielectric layer 216 may be relatively level after the first CMP process. For example, the top surface of dielectric layer 216 may be more level than a top surface of dielectric layer 216 immediately after deposition (see FIG. 7).

Next, as illustrated by FIG. 9B, CMP-stop layer 220 is formed within dielectric layer 216 using an implantation process as indicated by arrows 222. The implantation process may include implanting impurities of a type and dosage at an implantation energy as described above within dielectric layer 216. Because a first CMP process was applied to dielectric layer 216 prior to forming CMP-stop layer 220, CMP-stop layer 220 may be substantially level within dielectric layer 216. After CMP-stop layer 220 is formed, a top portion 216A of dielectric layer 216 remains over CMP-stop layer 220.

Subsequently, as illustrated in FIG. 9C, portion 216A (see FIG. 9B) of dielectric layer 216 is removed using a second CMP process. As discussed above, CMP-stop layer 220 is polished at a lower rate than dielectric layer 216 due to the implantation of impurities in CMP-stop layer 220. Thus, CMP-stop layer 220 acts a stopping layer during the CMP process, which may improve the planarity of a top surface 200A of device 200 after the second CMP. For example, compared to a top surface of dielectric layer 216 immediately after the first CMP process, top surface 200A may be more planar after the second CMP process. Furthermore, by including CMP-stop layer 220, improved process control for reducing dielectric layer 216 to a target height may be achieved. For example, CMP-stop layer 220 may be formed at a position within dielectric layer 216 (e.g., by configuring the implantation energy) so that a remaining portion of dielectric layer 216 is at a target height after the second CMP process.

After dielectric layer 216 is planarized, one or more etching processes may be applied to remove upper portions of dielectric layer 216 so that top surfaces of dielectric layer 216 and semiconductor regions 206A/206B are substantially level. For example, referring to FIG. 10, CMP-stop layer 220, upper portions of CESL 218, and upper portions of dielectric layer 216 are removed using wet and/or dry etching processes. After etching, top surfaces of dielectric layer 216 and CESL 218 may be substantially level with top surfaces of semiconductor regions 206A/206B. In the completed VGAA, remaining portions of dielectric layer 216 and CESL 218 around semiconductor regions 206A/206B are bottom isolation layers, which isolate bottom source/drain regions (e.g., semiconductor regions 206A/206B) from subsequently formed gate structures (e.g., gate structures 232A/232B, see FIG. 14). In various embodiments, dielectric layer 216 may be etched back to a target height with improved accuracy because of CMP-stop layer 220.

In some embodiments, dry etching processes may include using a dry etch gas, such as $HF/NH_3$, $NF_3/NH_3$, or a combination thereof. Example gas flow rates for a dry etching process may include flowing $NH_3$ at a rate of about 5 sccm to about 500 sccm, flowing NF at a rate of about 5 sccm to about 300 sccm, and/or flowing $NF_3$ at a rate of about 10 sccm to about 500 sccm. Furthermore, remote plasma power of about 5 W to about 100 W may be applied during etching in an example embodiment. Other dry etching process conditions (e.g., other gases, flow speeds, applied power) may be used in other embodiments. In some embodiments, wet etching processes may include using a chemical etchant such as diluted hydrogen fluoride (DHF) at a dilution ratio of about 10:1 to about 500:1, for example. Other chemical etchants may be used as well.

Figure 11A:
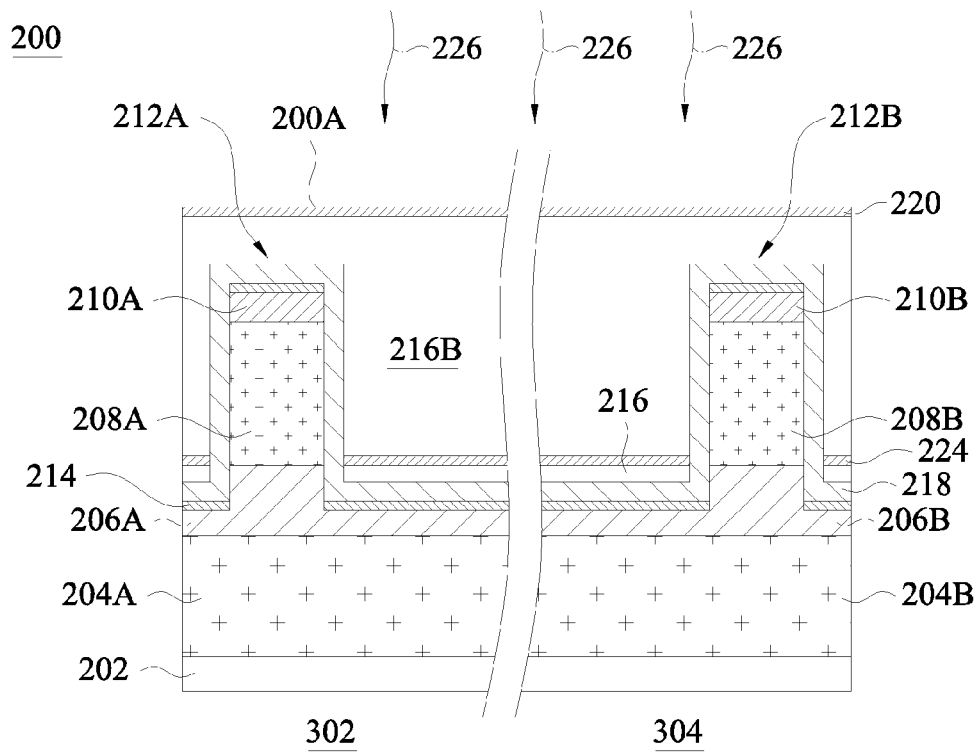
Figure 11B:
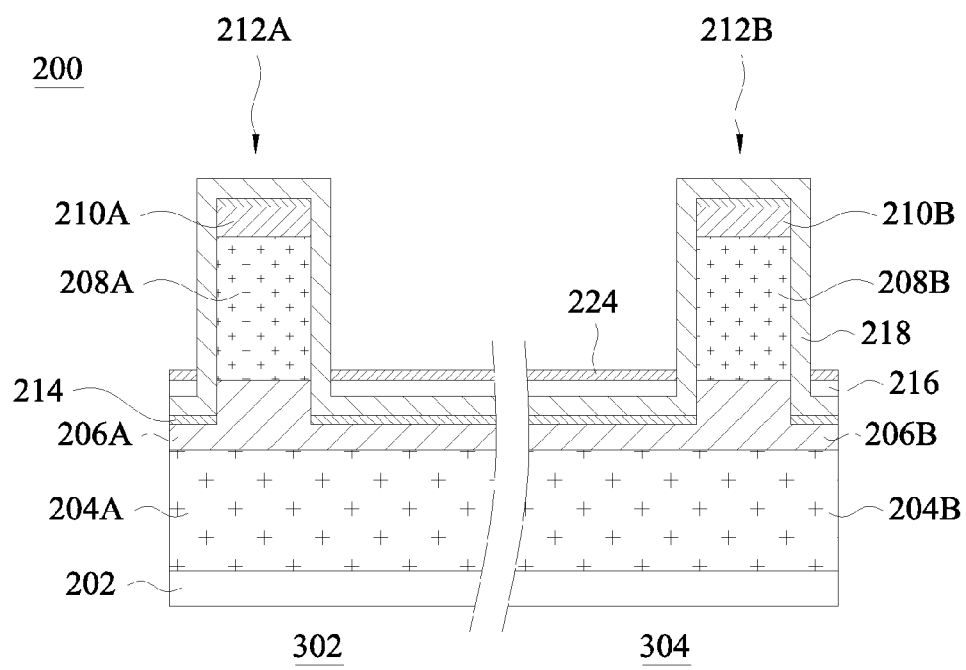

FIGS. 11A through 11B illustrate various intermediary steps of removing upper portions of dielectric layer 216 so that top surfaces of dielectric layer 216 and semiconductor regions 206A/206B are substantially level according to another embodiment. Referring first to FIG. 11A, an etch-stop layer 224 is formed within dielectric layer 216 using an implantation process as indicated by arrows 226 after dielectric layer 216 is planarized. In an embodiment etch-stop layer 224 is formed prior to removing CMP-stop layer 220. During implantation, process conditions (e.g., implantation energy) may be controlled so that a bottom surface of etch-stop layer 224 is substantially level with a top surface of semiconductor regions 206A/206B. For example, in an embodiment, the implantation energy for etch-stop layer 224 may be between about 0.1 KeV to about 350 KeV. The specific implantation energy used may be selected in accordance with a distance from top surface 200A of device 200 to top surfaces of semiconductor regions 206A/206B. After etch-stop layer 224 is formed, a lower portion of dielectric layer 216 may remain under etch-stop layer 224.

In an embodiment, suitable impurities (e.g., Si, C, N, combinations thereof, and the like) are implanted within dielectric layer 216 at a suitable concentration (e.g., $1\times10^{13}$ atoms/cm$^2$ to about $1\times10^{16}$ atoms/cm$^2$) to form etch-stop layer 224. As a result of the implantation process, a portion of dielectric layer 216 having such impurities is transformed into etch-stop layer 224. The resulting etch-stop layer 224 may comprise polysilicon, a nitride, SiCN, or the like. It has been observed by implanting impurities of the above type and concentration, etch-stop layer 224 may be formed to have a lower etching rate than dielectric layer 216 during subsequent etching processes (e.g., as described with respect to FIG. 10, above). For example, it has been observed that when etch-stop layer 224 comprises polysilicon (e.g., from Si implantation), a ratio of the etching rate of dielectric layer 216 to etch-stop layer 224 is at least 150:1 when using HF/NH$_3$ or NF$_3$/NH$_3$ as etching gases. As another example, it has been observed that when etch-stop layer 224 comprises a nitride (e.g., from N implantation), a ratio of the etching rate of dielectric layer 216 to etch-stop layer 224 is about 1:1 to about 14:1 when using HF/NH$_3$ or NF$_3$/NH$_3$ as etching gases. As another example, it has been observed that when etch-stop layer 224 comprises SiCN (e.g., from C and N implantation), a ratio of the etching rate of dielectric layer 216 to etch-stop layer 224 is at least about 10:1 when using HF/NH$_3$ or NF$_3$/NH$_3$ as etching gases. Thus the formation of etch-stop layer 224 allows upper portions of dielectric layer 216 (labeled 216B) to be selectively removed with improved process control. Other embodiments may include forming etch-stop layer 224 having different impurities, at different implantation concentration, at different implantation energies, and the like depending on process design.

Figure 10:
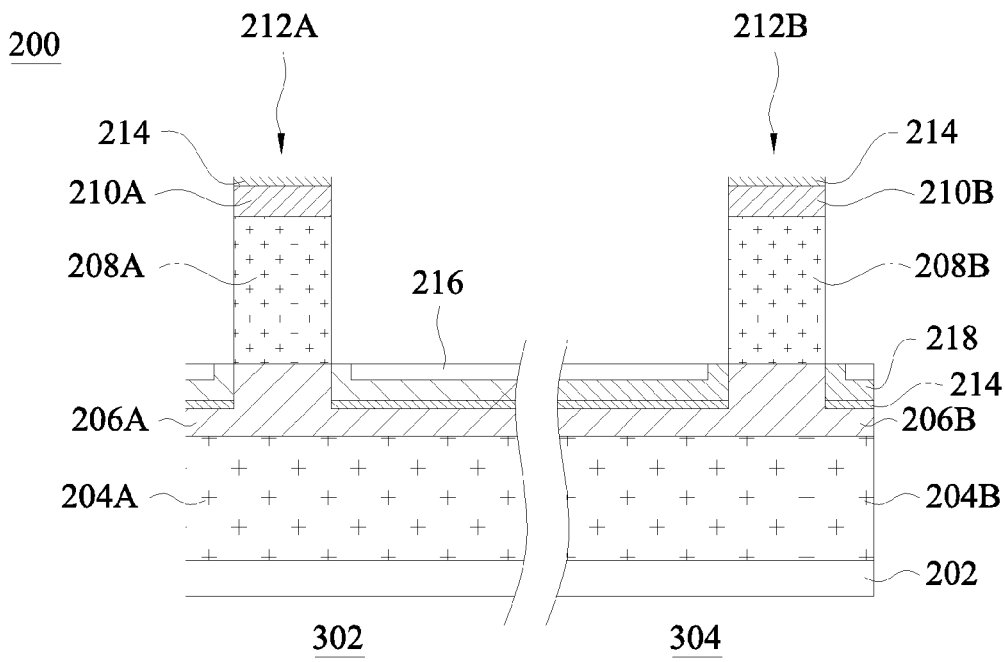

Next, as illustrated by FIG. 11B, upper portion 216B (see FIG. 11A) of dielectric layer 216 is removed using dry and/or wet etching processes as described above. CMP-stop layer 220 may also be removed. The removal process may use process gases and/or chemical etchants that remove dielectric layer 216 at a faster rate than etch-stop layer 224. Thus, etch-stop layer 224 acts as a stopping point for the etching process, and portion 216B of dielectric layer 216 may be removed with improved process control. Subsequently, etch-stop layer 224 and upper portions of CESL 218 may be removed using a suitable dry or wet etching process. After etch-stop layer 224 is removed, a remaining portion of dielectric layer 216 may have a top surface that is substantially level with top surfaces of semiconductor regions 206A/206B. The resulting structure is illustrated in FIG. 10.

Figure 12A:
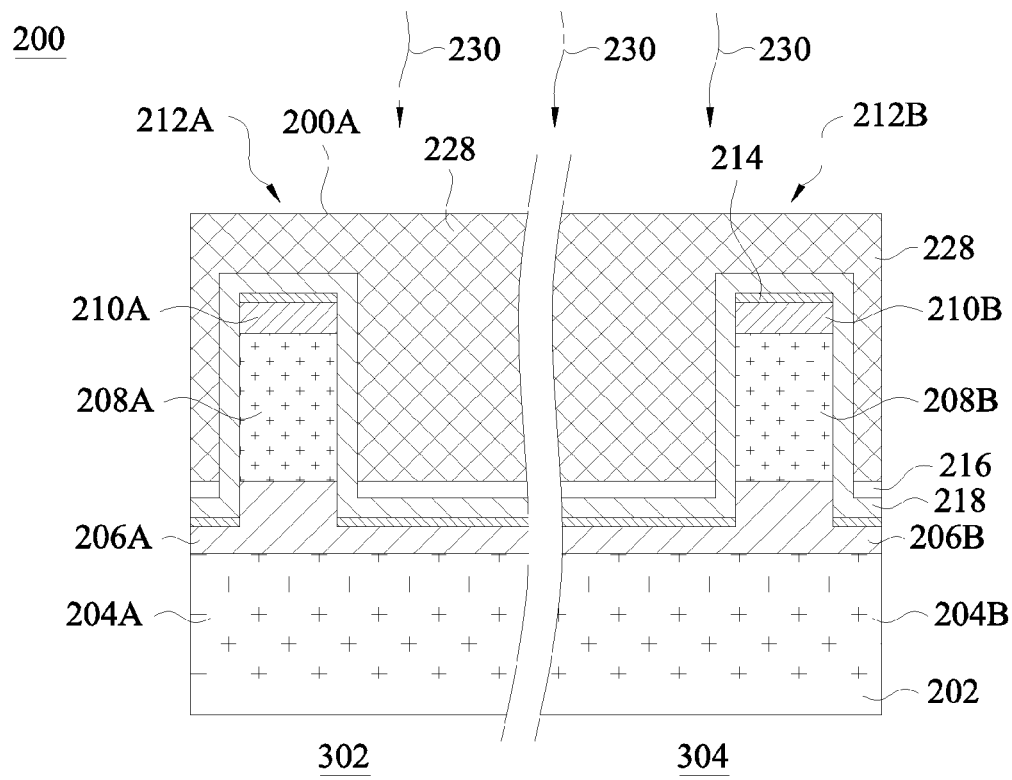
Figure 12B:
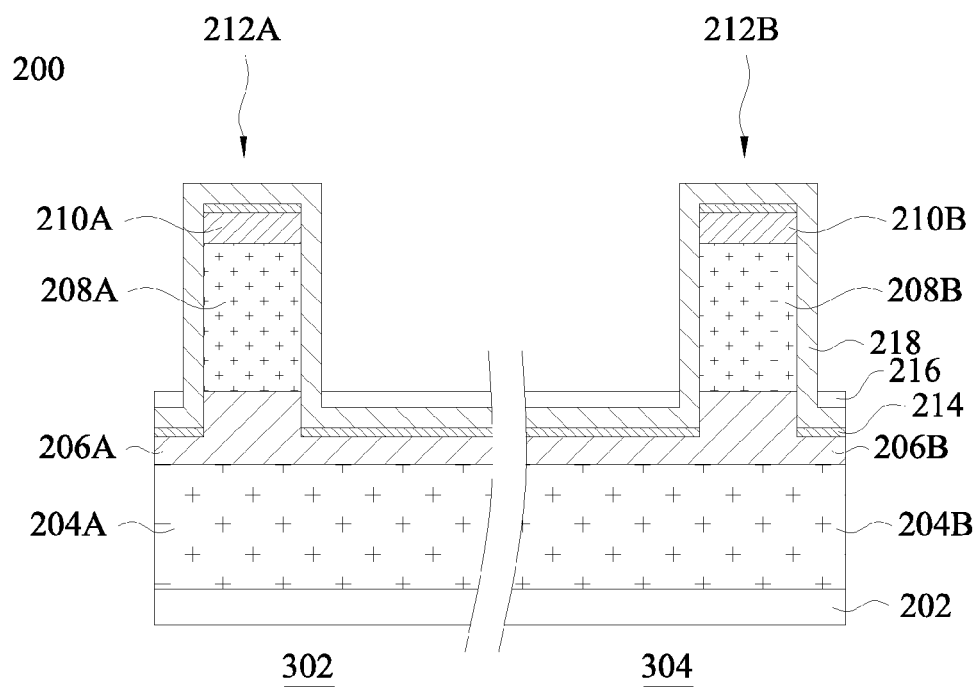

FIGS. 12A through 12B illustrate various intermediary steps of removing upper portions of dielectric layer 216 so that top surfaces of dielectric layer 216 and semiconductor regions 206A/206B are substantially level according to another embodiment. Referring first to FIG. 12A, after dielectric layer 216 is planarized, CMP-stop layer 220 is removed and an etching layer 228 is formed within dielectric layer 216 using an implantation process as indicated by arrows 230. During implantation, process conditions (e.g., implantation energy) may be controlled so that etching layer 228 extends from top surface 200A of semiconductor device 200 to same height as a top surface of semiconductor regions 206A/206B. For example, in an embodiment, the implantation energy for etching layer 228 may be between about 0.1 KeV to about 350 KeV. The specific implantation energy used may be selected in accordance with a distance from top surface 200A of device 200 to top surfaces of semiconductor regions 206A/206B. For example, it has been observed that a thickness of etching layer 228 can be increased by increasing the implantation energy. After etching layer 228 is formed, a lower portion of dielectric layer 216 may remain under etching layer 228.

In an embodiment, suitable impurities (e.g., Ar, Xe, Si, Ge, As, P, B, combinations thereof, and the like) are implanted within dielectric layer 216 at a suitable concentration (e.g., $1\times10^{13}$ atoms/cm$^2$ to about $1\times10^{16}$ atoms/cm$^2$) to form etching layer 228. As a result of the implantation process, a portion of dielectric layer 216 having such impurities is transformed into etching layer 228. It has been observed by implanting impurities of the above type and concentration, etching layer 228 may be formed to have a higher etching rate than dielectric layer 216 during subsequent etching processes by selecting appropriate etchants (e.g., as described with respect to FIG. 10, above). Thus, remaining portions of dielectric layer 216 may act as an etch-stop layer when etching layer 228 is removed. By implanting impurities to increase an etching rate of upper portions of dielectric layer 216 (e.g., etching layer 228), an etch-stop layer is formed from remaining portions of dielectric layer 216. Other embodiments may include forming etching layer 228 having different impurities, at different implantation concentration, at different implantation energies, and the like depending on process design.

Next, as illustrated by FIG. 12B, etching layer 228 is removed using dry and/or wet etching processes as described above. The removal process may use process gases and/or chemical etchants that remove etching layer 228 at a faster rate than dielectric layer 216. Thus, dielectric layer 216 acts as a stopping point (e.g., an etch-stop layer) for the etching process, etching layer 228 (e.g., previously an upper portion of dielectric layer 216) may be removed with improved process control. Subsequently, upper portions of CESL 218 may be removed using a suitable dry or wet etching process. After upper portions of CESL and etching layer 228 are removed, dielectric layer 216 may have a top surface that is substantially level with top surfaces of semiconductor regions 206A/206B. The resulting structure is illustrated in FIG. 10.

Figure 13:
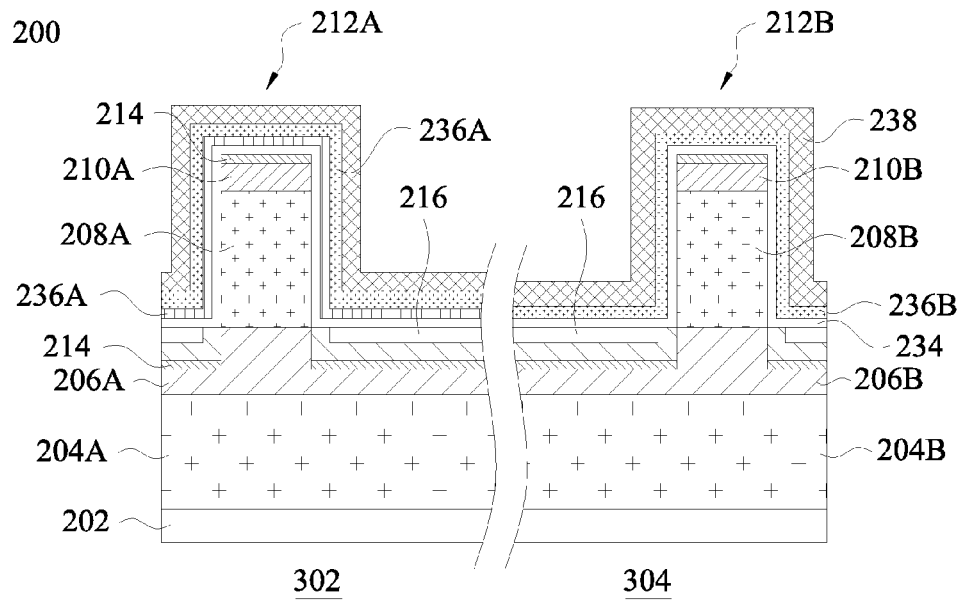
Figure 14:
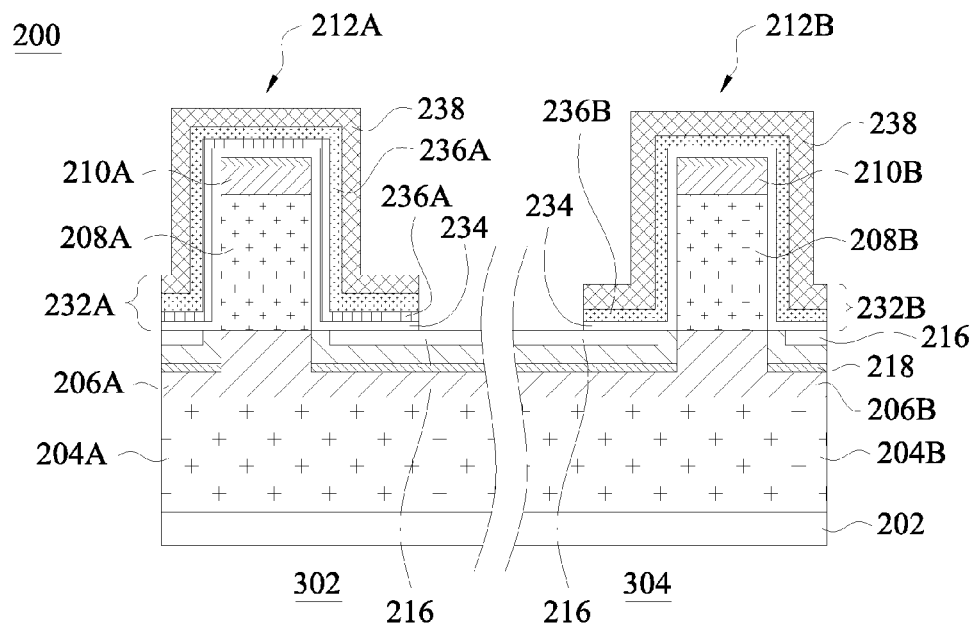

FIGS. 13 and 14 are cross-sectional views of semiconductor device 200 at various stages of fabrication according to embodiments of process flow 100 of FIG. 1. Specifically, FIGS. 13 and 14 illustrate intermediary stages of forming a gate structure (e.g., gate structures 232A/232B, see FIG. 14) over the first dielectric layer (e.g., dielectric layer 216) and around a middle channel region (e.g., semiconductor regions 208A/208B) of the nanowire (e.g., nanowires 212A/212B) according to step 106 of process flow 100.

Referring first to FIG. 14, a gate dielectric layer 234; work function metal layers 236A and 236B; and gate electrode layer 238 are formed over dielectric layer 216 and on a top surface and sidewalls of exposed portions of nanowires 212A/212B. Gate dielectric layer 234, work function metal layer 236A, work function metal layer 236B, and gate electrode layer 238 may each be sequentially deposited as conformal layers over nanowires 212A/212B using any suitable process. Additional layers, such as, interfacial layers (not shown) may also be deposited (e.g., between gate dielectric layer 234 and nanowires 212A/212B).

In some embodiments, gate dielectric layer 234 includes silicon oxide, silicon nitride, or multilayers thereof. Additionally or alternatively, gate dielectric layer 234 may include a high-k dielectric material. In such embodiments, gate dielectric layer 234 may have a k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The formation methods of gate dielectric layer 234 may include molecular beam deposition (MBD), ALD, PECVD, and the like.

After gate dielectric layer 234 is formed, work function metal layer 236A and work function metal layer 236B are formed over gate dielectric layer 234. In p-type device region 302, a p-type work function metal layer 236A is deposited over gate dielectric layer 234. Work function metal layer 236A may initially be formed over nanowire 212B in n-type device region 304 as well, and portions of work function metal layer 236A n-type region 304 may be removed after deposition using a suitable patterning process (e.g., a combination of photolithography and etching). After work function metal layer 236A is patterned, an n-type work function metal layer 236B is formed over work function metal layer 236A. In some embodiments, n-type work function metal layer 236B may be formed in both p-type device region 302 as well as n-type device region 304. Work function metal layers 236A and 236B may comprise different materials used to adjust the work function of gate stacks 232A/232B (see FIG. 14) to a desired value based on device design. In an embodiment work function metal layers 236A and 236B may comprise titanium nitride (TiN), titanium aluminum (TiAl), titanium aluminum carbon (TiAlC), tantalum silicon (TaSi), combinations thereof, or the like.

Conductive gate electrode layer 238 is formed then over work function metal layers 236A/236B using a suitable deposition process such as MBD, ALD, PECVD, and the like. Gate electrode layer 238 may include a metal-containing material such as titanium nitride (TiN), tantalum nitride (TaN), tantalum carbon (TaC), cobalt (Co), ruthenium (Ru), aluminum (Al), combinations thereof, multi-layers thereof, and the like.

Next, in FIG. 14, gate dielectric layer 234, work function metal layer 236A, work function metal layer 236B, and gate electrode layer 238 are patterned to remove portions extending between adjacent VGAA devices (e.g., portions between nanowires 212A/212B). Thus, gate structures 232A and 232B are formed around nanowires 212A and 212B, respectively. Gate structures 232A and 232B may encircle all sides of semiconductor regions 208A and 208B of nanowires 212A and 212B, respectively. Gate structures 232A and 232B may be spaced apart from and not contact bottom semiconductor regions 206A/206B due to the inclusion of dielectric layer 216, which functions as a spacer layer. Although each gate structure 232A and 232B is illustrated as encircling a single nanowire, each gate stack may encircle multiple nanowires depending on device design.

Figure 15:
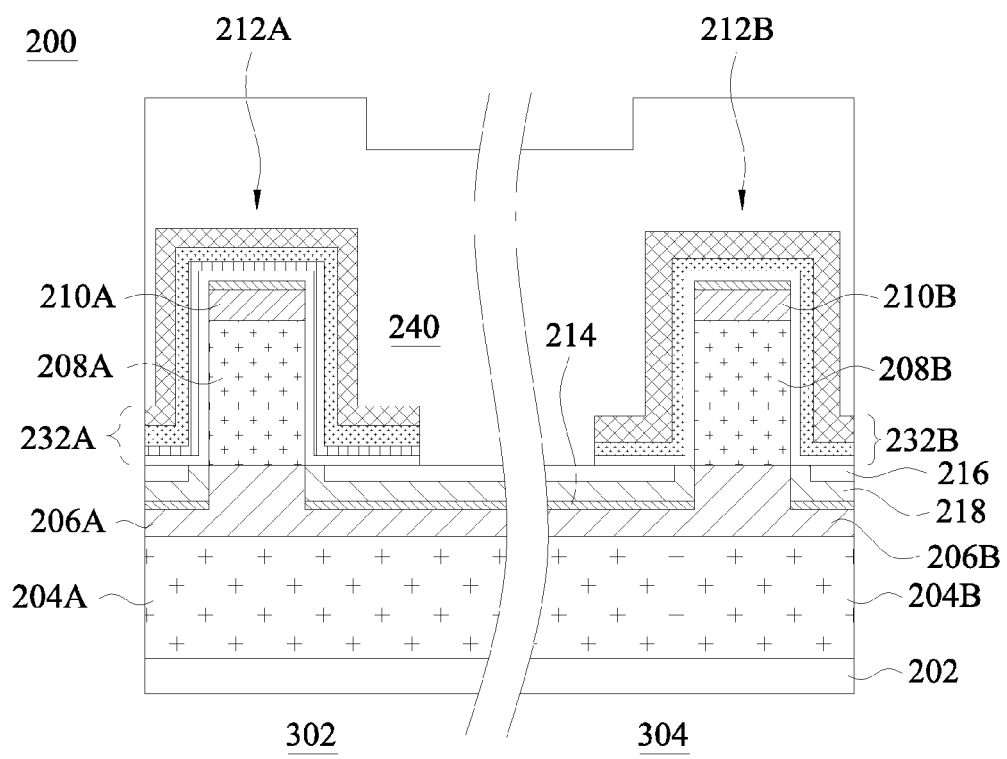

FIGS. 15 through 20 are cross-sectional views of semiconductor device 200 at various stages of fabrication according to embodiments of process flow 100 of FIG. 1. Specifically, FIGS. 15 through 20 illustrate intermediary stages of forming a second dielectric layer (e.g., dielectric layer 240, see FIG. 15) around a gate structure (e.g., gate structures 232A/232B) according to step 108 of process flow 100. Referring first to FIG. 15, a dielectric layer 240 is formed over gates structures 232A/232B. Dielectric layer 240 may comprise an insulating material such as an oxide, and dielectric layer 240 may be substantially similar to dielectric layer 216. Dielectric layer 240 may fill the space between adjacent gate structures (e.g., gate structures 232A/232B), and dielectric layer 240 may further extend above and cover top surfaces of gate structures 232A/232B. In some embodiments, a top surface of dielectric layer 240 may be non-planar because dielectric layer 240 is deposited on to the non-planar surface. For example, a portion of dielectric layer 240 directly over nanowires 212A/212B may be higher than other portions of dielectric layer 240. Furthermore, due to process limitations, heights of various nanowires (e.g., nanowires 212A/212B) may vary throughout device 200. For example, each nanowire may have a height variance of about 10 nm. Thus, a top surface of dielectric layer 240 may also vary in height throughout device 200.

Figure 16A:
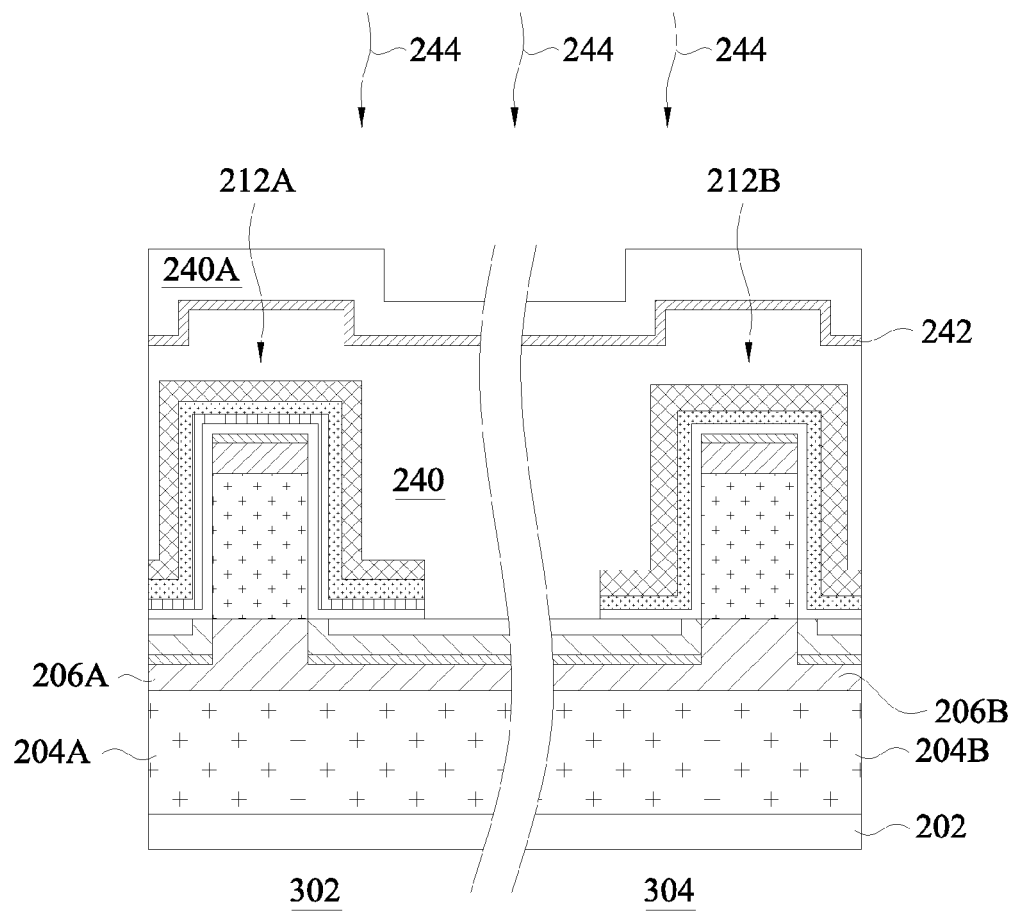
Figure 16B:
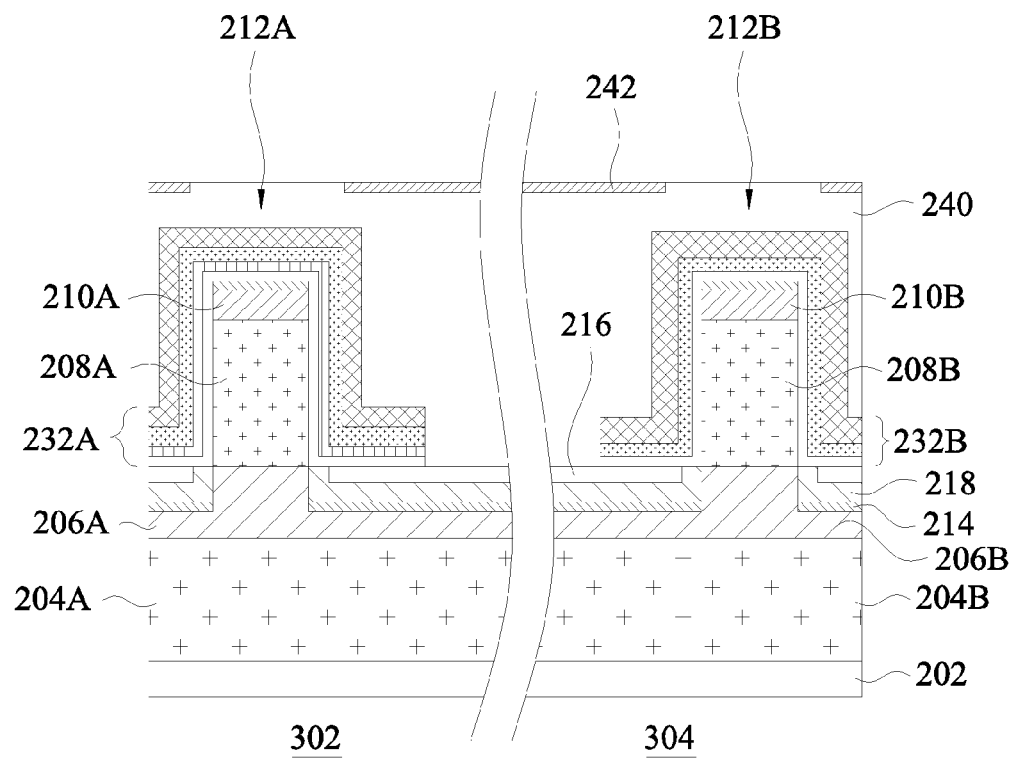

After dielectric layer 240 is deposited, a planarization process is applied to a top surface of dielectric layer 240. For example, FIGS. 16A and 16B illustrate planarizing dielectric layer 240 according in an embodiment. In FIG. 8A, a CMP-stop layer 242 is formed within and beneath a top surface of dielectric 240 using an implantation process as indicated by arrows 244. CMP-stop layer 242 may be substantially similar to and formed using similar processes as CMP-stop layer 220. For example, CMP-stop layer 242 may be formed by transforming a portion of dielectric layer 240 through implanting suitable impurities (e.g., Si, C, N, Ge, As, Ar, combinations thereof, and the like), at a suitable concentration (e.g., $1 \times 10^{13}$ atoms/cm$^2$ to about $1 \times 10^{16}$ atoms/cm$^2$), and at a suitable implantation energy (e.g., 0.01 KeV to about 350 KeV). Other embodiments may include forming CMP-stop layer 242 having different impurities, at different implantation concentration, at different implantation energies, and the like depending on process design. As a result of the implantation process, a portion of dielectric layer 240 having such impurities is transformed into CMP-stop layer 242. It has been observed by implanting impurities of the above type and concentration, CMP etch stop layer 242 may be formed to have a lower CMP polishing rate than dielectric layer 240.

After implantation, a portion of dielectric layer 240 (labeled 240A) may remain undoped (or less doped) over CMP-stop layer 240. For example, portion 240A may be substantially free of (or at least have a lower concentration of) the impurities implanted in CMP-stop layer 242. For example, in an embodiment, the impurity concentration of portion 240A is about $1 \times 10^{12}$ atoms/cm$^3$ or less, which may not be sufficient for portion 240A to act as a CMP-stop layer or an etch-stop layer. Because the top-surface of dielectric layer 240 is non-planar, CMP-stop layer 242 may also be non-planar. For example, a portion of CMP-stop layer 242 directly over nanowires 212A/212B may be higher than other portions of CMP-stop layer 242. Furthermore, CMP-stop layer 242 may be formed higher than gate structures 232A/232B to protect underlying gate structures 232A/232B during CMP.

Next in FIG. 16B, portion 240A of dielectric layer 240 is removed using a suitable planarization process, such as a CMP process as described above. CMP-stop layer 242 is polished at a lower rate than dielectric layer 240 due to the implantation of impurities in CMP-stop layer 242. Thus, CMP-stop layer 242 acts a stopping layer during the CMP process, which improves the planarity of a top surface 200A of device 200 after CMP. Including CMP-stop layer 242 also allows improved control for reducing dielectric layer 240 to a target height for improved process control. For example, CMP-stop layer 240 may be configured in accordance with a desired height for dielectric layer 240 after CMP.

Figure 17A:
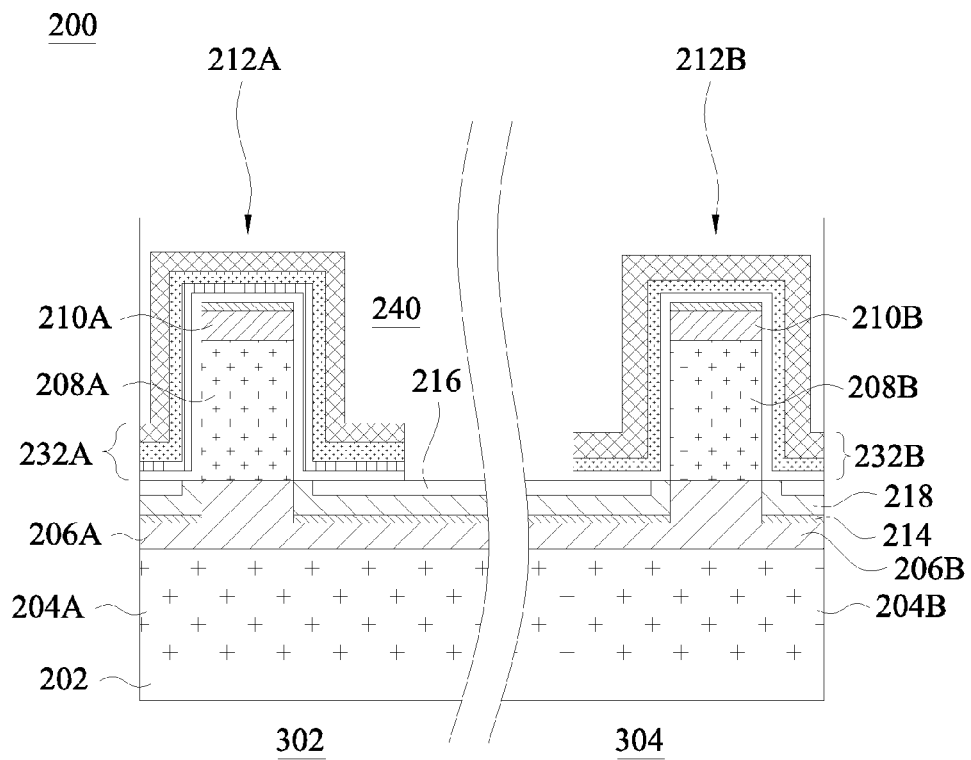
Figure 17B:
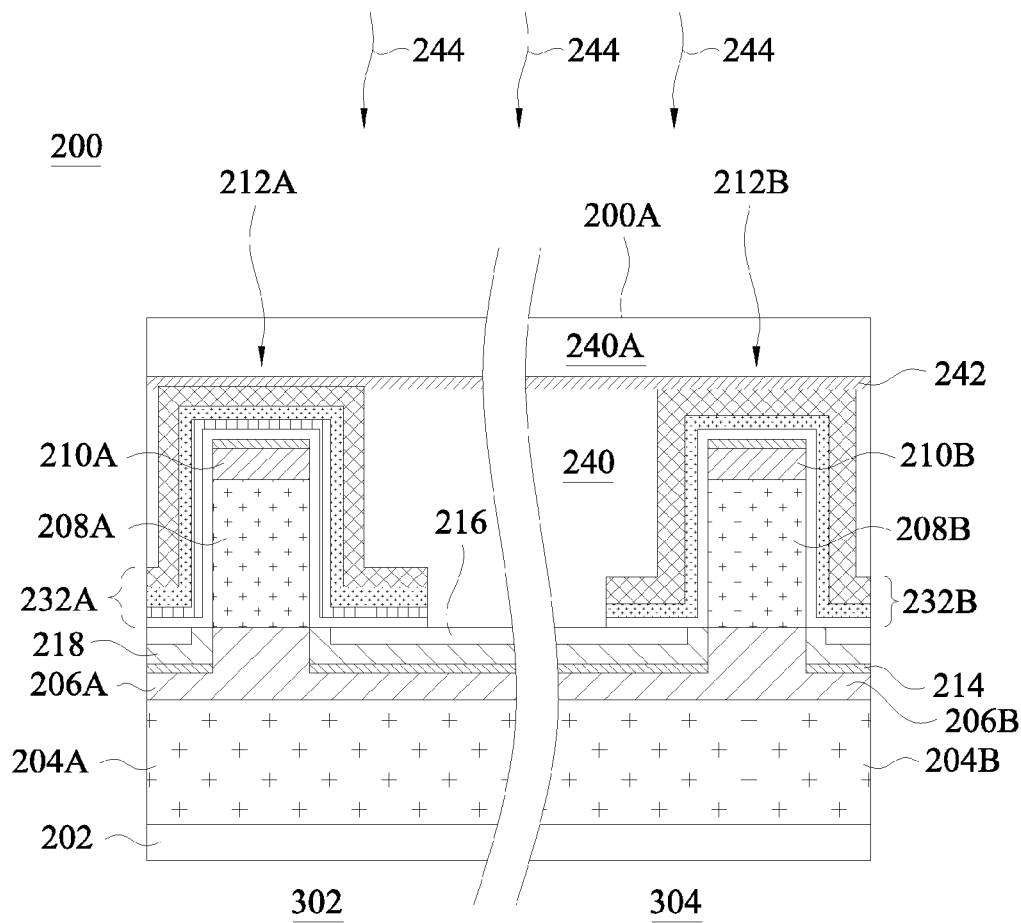
Figure 17C:
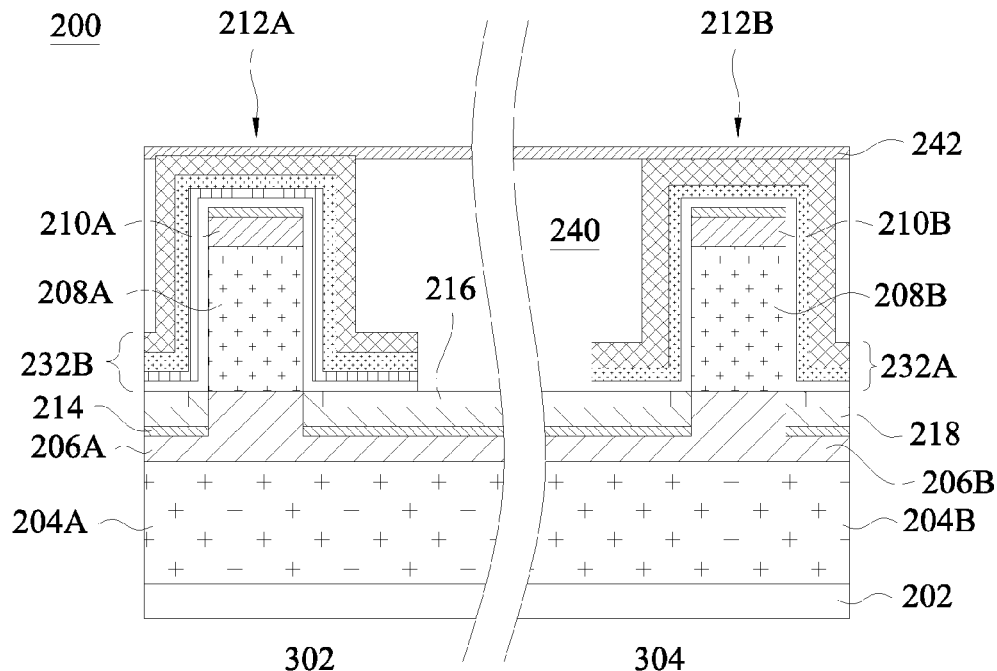

FIGS. 17A through 17C illustrate various intermediary steps of planarizing dielectric layer 240 according to another embodiment. In FIG. 17A, after dielectric layer 240 is deposited, a top surface of dielectric layer 240 may be planarized prior to forming CMP-stop layer 242 (see FIG. 17B). For example, a CMP process similar to that described above may be applied to dielectric layer 240 prior to forming CMP-stop layer 242. An upper portion of dielectric layer 240 may be removed, and a top surface of dielectric layer 240 may be relatively level after the first CMP process. For example, the top surface of dielectric layer 240 may be more level than a top surface of dielectric layer 240 immediately after deposition (see FIG. 15).

Next, as illustrated by FIG. 17B, CMP-stop layer 242 is formed within dielectric layer 240 using an implantation process as indicated by arrows 244. CMP-stop layer 242 may be formed higher than gate structures 232A/232B to protect gate structures 232A/232B during CMP. The implantation process may include implanting impurities of a type, a dosage, and at an implantation energy as described above within dielectric layer 240. Because a CMP process was applied to dielectric layer 240 prior to forming CMP-stop layer 242, CMP-stop layer 242 may be substantially level within dielectric layer 240. After CMP-stop layer 242 is formed, an upper portion 240A of dielectric layer 216 remains over CMP-stop layer 220. Subsequently, as illustrated in FIG. 17C, portion 240A (see FIG. 17B) of dielectric layer 240 is removed using another CMP process. As discussed above, CMP-stop layer 242 is polished at a lower rate than dielectric layer 240 due to the implantation of impurities to form CMP-stop layer 242. Thus, CMP-stop layer 242 acts a stopping layer during the CMP process, which may improve the planarity of a top surface 200A of device 200. Furthermore, by including CMP-stop layer 242, improved process control for reducing dielectric layer 240 to a target height may be achieved.

After dielectric layer 240 is planarized, one or more etching processes may be applied to remove upper portions of dielectric layer 240 so that top surfaces of dielectric layer 240 and semiconductor regions 208A/208B are substantially level. For example, referring to FIG. 18, CMP-stop layer 242 and upper portions of dielectric layer 240 are removed using wet and/or dry etching processes as described above. After etching, top surfaces of dielectric layer 240 may be substantially level with top surfaces of semiconductor regions 208A/208B as well as bottom surfaces of semiconductor regions 210A/210B. In various embodiments, dielectric layer 240 may be etched back to a target height with improved accuracy because of CMP-stop layer 242. By recessing dielectric layer 240, upper portions of gate structures 232A/232B may be exposed and subsequently removed to expose top source/drain regions (e.g., semiconductor regions 210A/210B).

Figure 18:
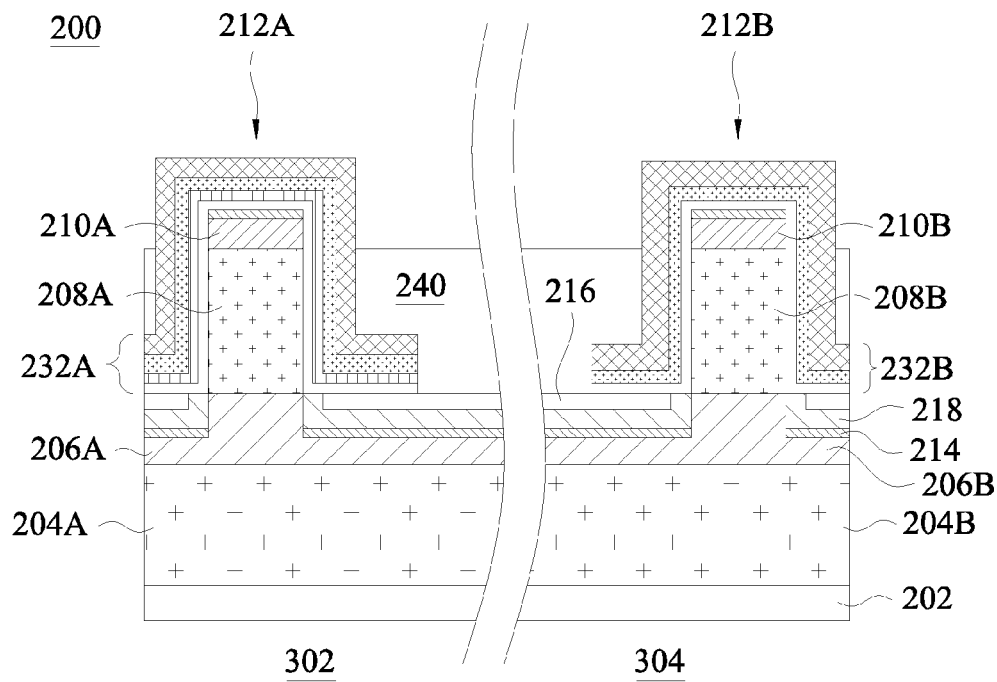
Figure 19A:
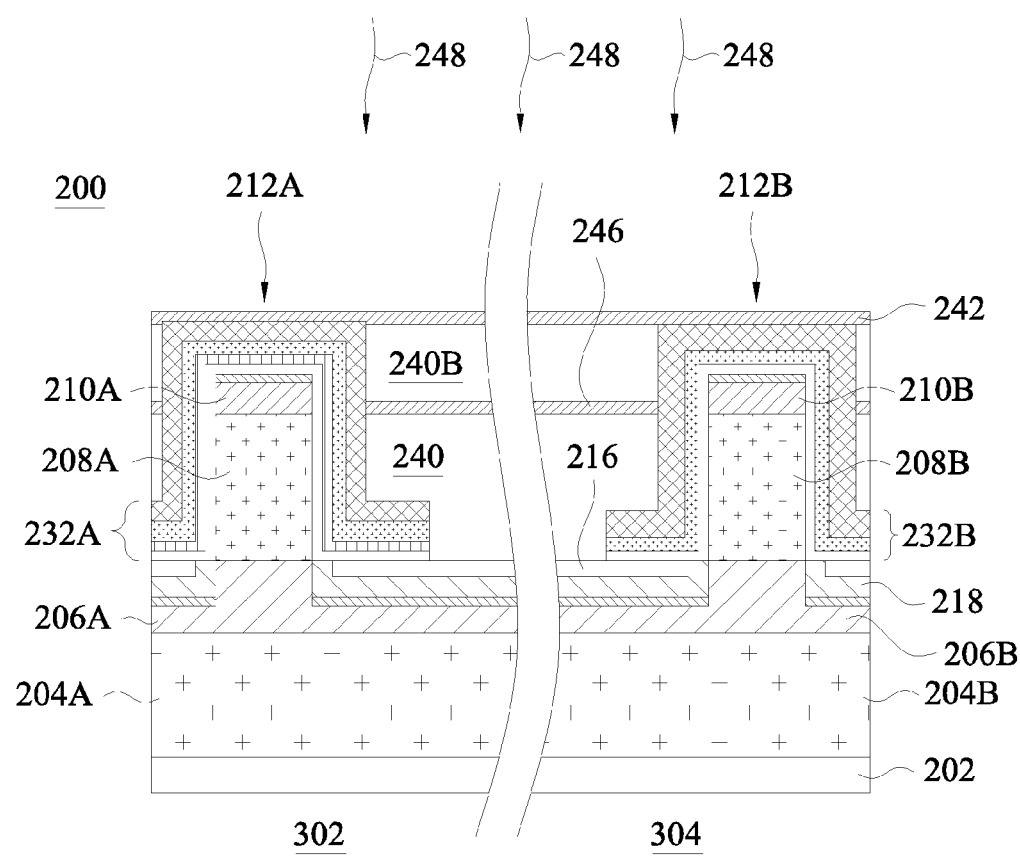
Figure 19B:
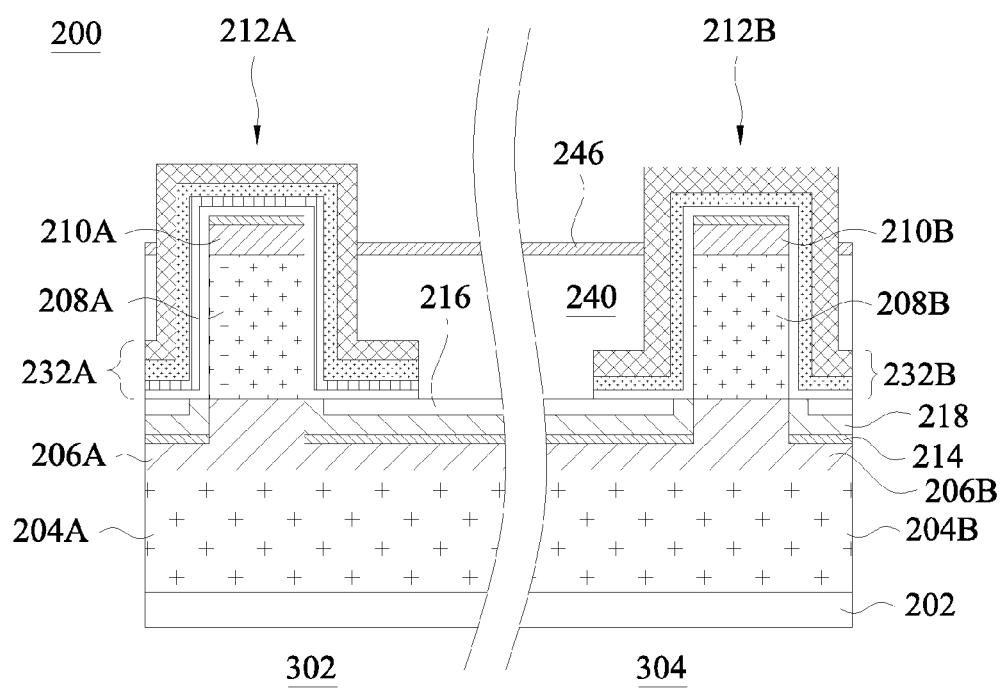

FIGS. 19A through 19B illustrate various intermediary steps of removing upper portions of dielectric layer 240 so that top surfaces of dielectric layer 240 and semiconductor regions 208A/208B are substantially level according to another embodiment. Referring first to FIG. 19A, after dielectric layer 216 is planarized, an etch-stop layer 246 is formed within dielectric layer 240 using an implantation process as indicated by arrows 248. Etch-stop layer 246 may be formed in a substantially similar way as etch-stop layer 224 in FIG. 11A. For example, etch-stop layer 246 may be formed by transforming a portion of dielectric layer 240 through implanting suitable impurities (e.g., Si, C, N, combinations thereof, and the like), at a suitable concentration (e.g., $1\times10^{13}$ atoms/cm$^2$ to about $1\times10^{16}$ atoms/cm$^2$), and at a suitable implantation energy (e.g., 0.01 KeV to about 350 KeV). Other embodiments may include forming etch-stop layer 246 having different impurities, at different implantation concentration, at different implantation energies, and the like depending on process design. The specific implantation energy used may be selected in accordance with a distance from top surface 200A of device 200 to top surfaces of semiconductor regions 208A/208B. After etch-stop layer 224 is formed, a lower portion of dielectric layer 240 may remain under etch-stop layer 224. The resulting etch-stop layer 246 may comprise polysilicon, a nitride, SiCN, or the like. It has been observed by implanting impurities of the above type and concentration, etch-stop layer 246 may be formed to have a lower etching rate than dielectric layer 240 during subsequent etching processes (e.g., as described with respect to FIG. 18, above). Thus the formation of etch-stop layer 224 allows upper portions of dielectric layer 240 (labeled 240B) to be selectively removed with improved process control.

Next, as illustrated by FIG. 19B, upper portion 240B (see FIG. 19A) of dielectric layer 240 is removed using dry and/or wet etching processes as described above. CMP-stop layer 242 may also be removed. The removal process may use process gases and/or chemical etchants that remove dielectric layer 240 at a faster rate than etch-stop layer 246. Thus, etch-stop layer 246 acts as a stopping point for the etching process, and portion 240B of dielectric layer 216 may be removed with improved process control. Subsequently, etch-stop layer 246 may be removed using a suitable dry or wet etching process. After etch-stop layer 246 is removed, a remaining portion of dielectric layer 240 may have a top surface that is substantially level with top surfaces of semiconductor regions 208A/208B. The resulting structure is illustrated in FIG. 18.

Figure 20A:
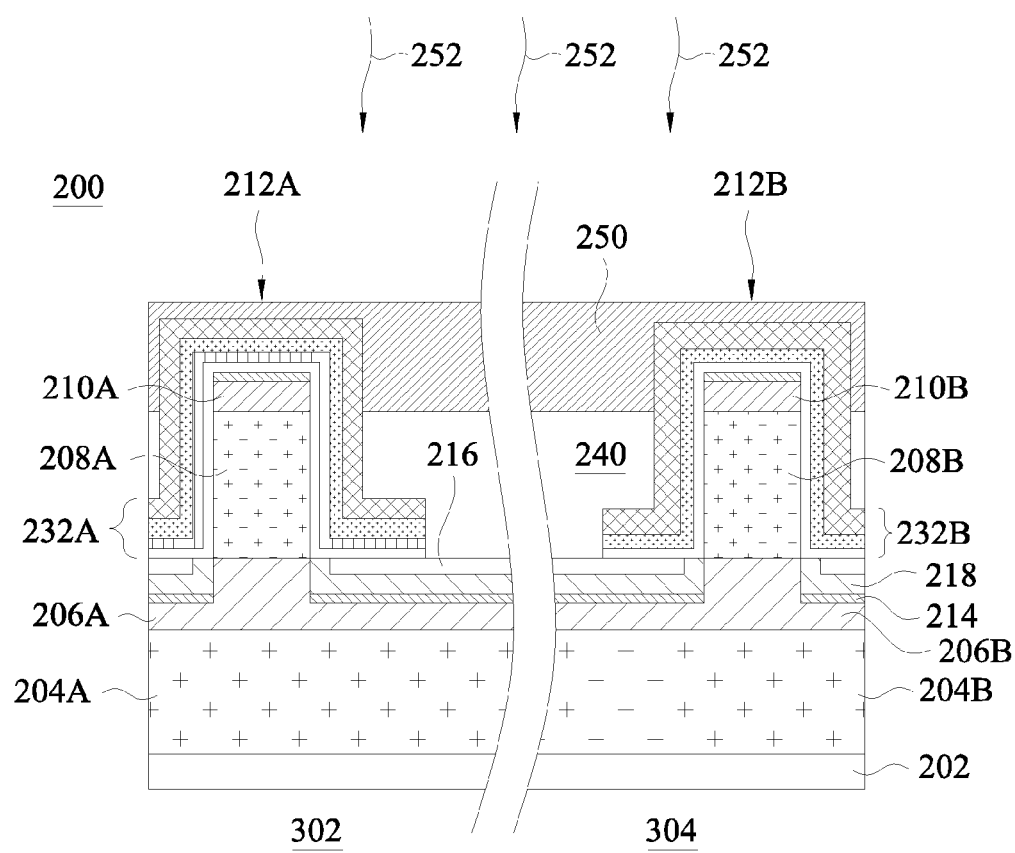
Figure 20B:
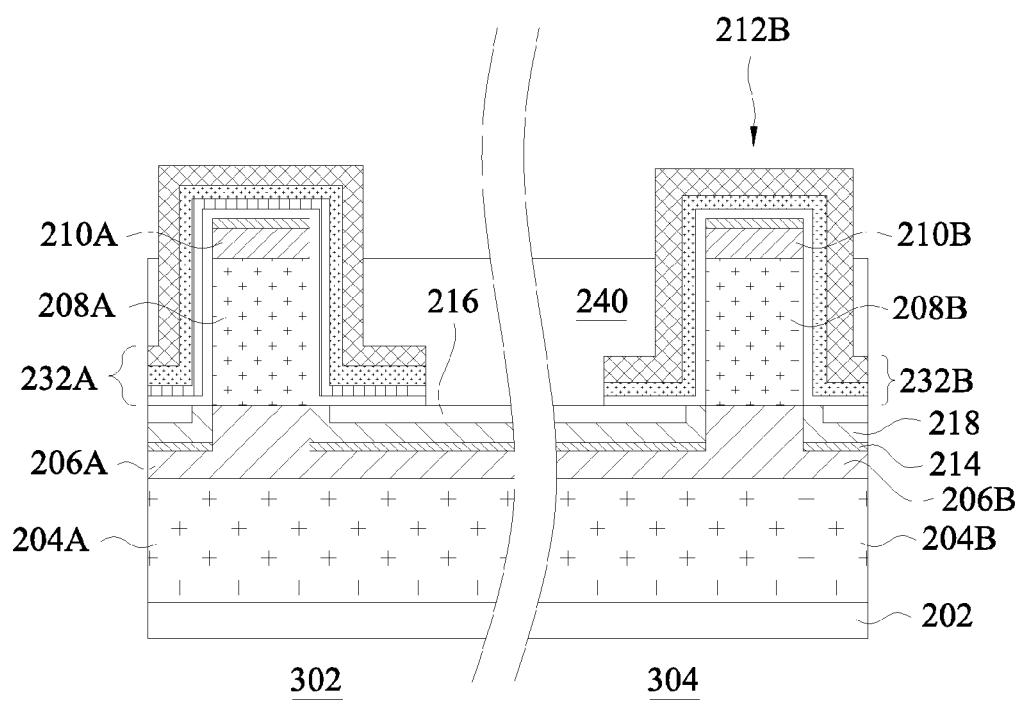

FIGS. 20A and 20B illustrate various intermediary steps of removing upper portions of dielectric layer 240 so that top surfaces of dielectric layer 240 and semiconductor regions 208A/208B are substantially level according to another embodiment. Referring first to FIG. 20A, after dielectric layer 216 is planarized, CMP-stop layer 242 is removed and an etching layer 250 is formed within dielectric layer 240 using an implantation process as indicated by arrows 254.

Etching layer 250 may be formed in a substantially similar way as etching layer 228 in FIG. 12A. For example, etching layer 250 may be formed by transforming a portion of dielectric layer 240 through implanting suitable impurities (e.g., Ar, Xe, Si, Ge, As, P, B, combinations thereof, and the like), at a suitable concentration (e.g., $1\times10^{13}$ atoms/cm$^2$ to about $1\times10^{16}$ atoms/cm$^2$), and at a suitable implantation energy (e.g., 0.01 KeV to about 350 KeV). Other embodiments may include forming etching layer 250 having different impurities, at different implantation concentration, at different implantation energies, and the like depending on process design. During implantation, process conditions (e.g., implantation energy) may be controlled so that etching layer 250 extends from top surface 200A of semiconductor device 200 to a same height as a top surface of semiconductor regions 208A/208B. It has been observed by implanting impurities of the above type and concentration, etching layer 250 may be formed to have a higher etching rate than dielectric layer 240 during subsequent etching processes (e.g., as described with respect to FIG. 18, above). Thus, remaining portions of dielectric layer 240 may act as an etch-stop layer while etching layer 250 is removed. By implanting impurities to increase an etching rate of upper portions of dielectric layer 240 (e.g., etching layer 250), an etch-stop layer is formed from remaining portions of dielectric layer 240.

Next, as illustrated by FIG. 20B, etching layer 250 is removed using dry and/or wet etching processes as described above. The removal process may use process gases and/or chemical etchants that remove etching layer 250 at a faster rate than dielectric layer 240. Thus, dielectric layer 240 acts as a stopping point for the etching process, and etching layer 250 (e.g., previously an upper portion of dielectric layer 240) may be removed with improved process control. After etching layer 250 is removed, dielectric layer 240 may have a top surface that is substantially level with top surfaces of semiconductor regions 208A/208B.

Figure 21:
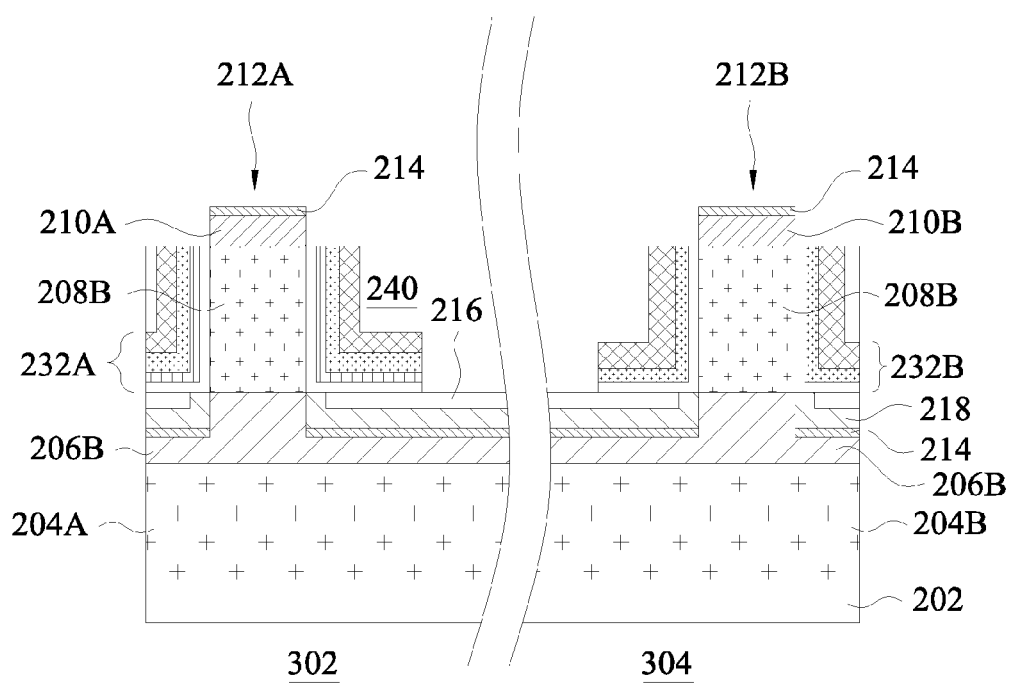

FIG. 21 illustrates a cross-sectional view of semiconductor device 200 at an intermediate stage of fabrication according to embodiments of process flow 100 of FIG. 1. Specifically, FIG. 21 illustrates etching back a gate structure (e.g., gate structures 232A/232B) to expose a top source/drain region (e.g., semiconductor regions 210A/210B) of a nanowire (e.g., nanowires 212A/212B) according to step 110 of process flow 100. The etch back process may further removes portions of gate structures 232A/232B extending over a top surface of dielectric layer 240 and contacting top semiconductor regions 210A/210B. After etching, top surfaces of gate structures 232A/232B are substantially level with top surfaces of dielectric layer 240 and semiconductor regions 208A/208B. Thus, in the resulting structure, gate structures 232A/232B may only be disposed on sidewalls of middle semiconductor regions 208A/208B (e.g., middle channel regions), and gate structures 232A/232B may not share any interfaces with top or bottom semiconductor regions 206A/206B/210A/210B (e.g., top and bottom source/drain regions). By etching back dielectric layer 240 using the process conditions as described above, the height and profile of dielectric layer 240 may be more accurately controlled, which may allow for improved process control for etching back gate structures 232A/232B.

Figure 22:
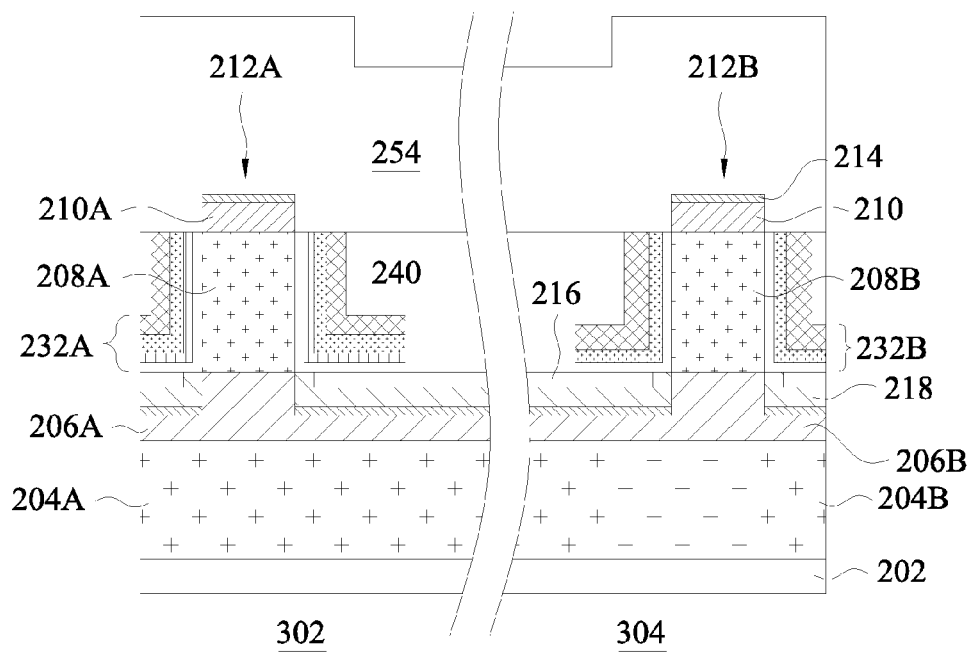
Figure 23:
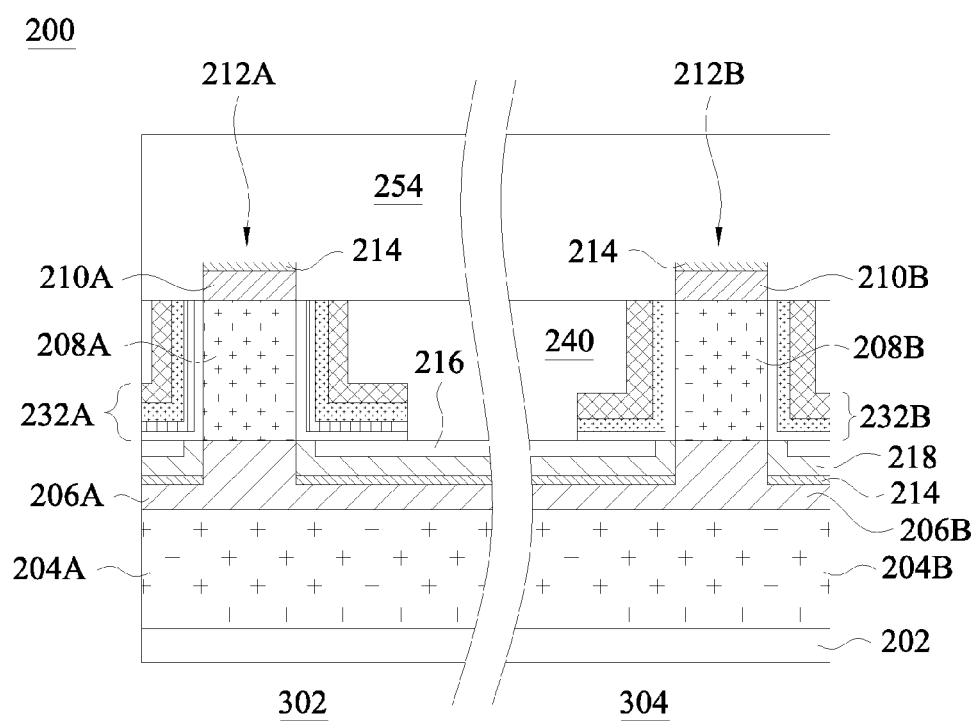

FIGS. 22 and 23 illustrate cross-sectional views of semiconductor device 200 at an intermediate stage of fabrication according to embodiments of process flow 100 of FIG. 1. Specifically, FIGS. 22 and 23 illustrate forming a third dielectric layer (e.g., dielectric layer 254) over the gate structure (e.g., gate structures 232A/232B) and around the top source drain region (e.g., semiconductor regions 210A/210B) of the nanowire (e.g., nanowires 212A/212B) according to step 112 of process flow 100. Referring first to FIG. 22, a dielectric layer 254 is formed over dielectric layer 240 and nanowires 212A/212B. Dielectric layer 254 may comprise an insulating material such as an oxide, and dielectric layer 254 may be substantially similar to dielectric layers 216 and 240. Dielectric layer 254 may fill the space between adjacent nanowires 212A/212B (e.g., spaces between top semiconductor regions 210A/210B), and dielectric layer 254 may further extend above and cover top surfaces of nanowires 212A/212B. In some embodiments, a top surface of dielectric layer 254 may be non-planar because dielectric layer 254 is deposited on to the non-planar surface. For example, a portion of dielectric layer 254 directly over nanowires 212A/212B may be higher than other portions of dielectric layer 240. Subsequently, as illustrated by FIG. 23, a planarization process (e.g., a CMP as described above) may be applied to a top surface of dielectric layer 254.

Figure 24:
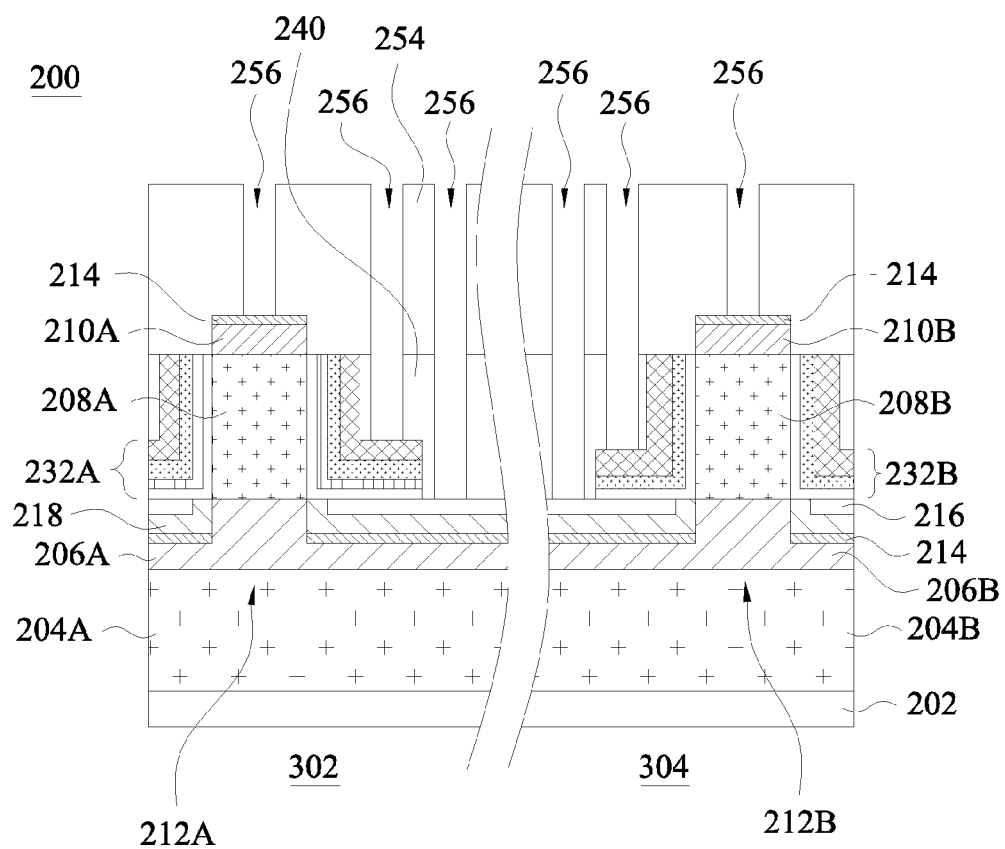
Figure 25:
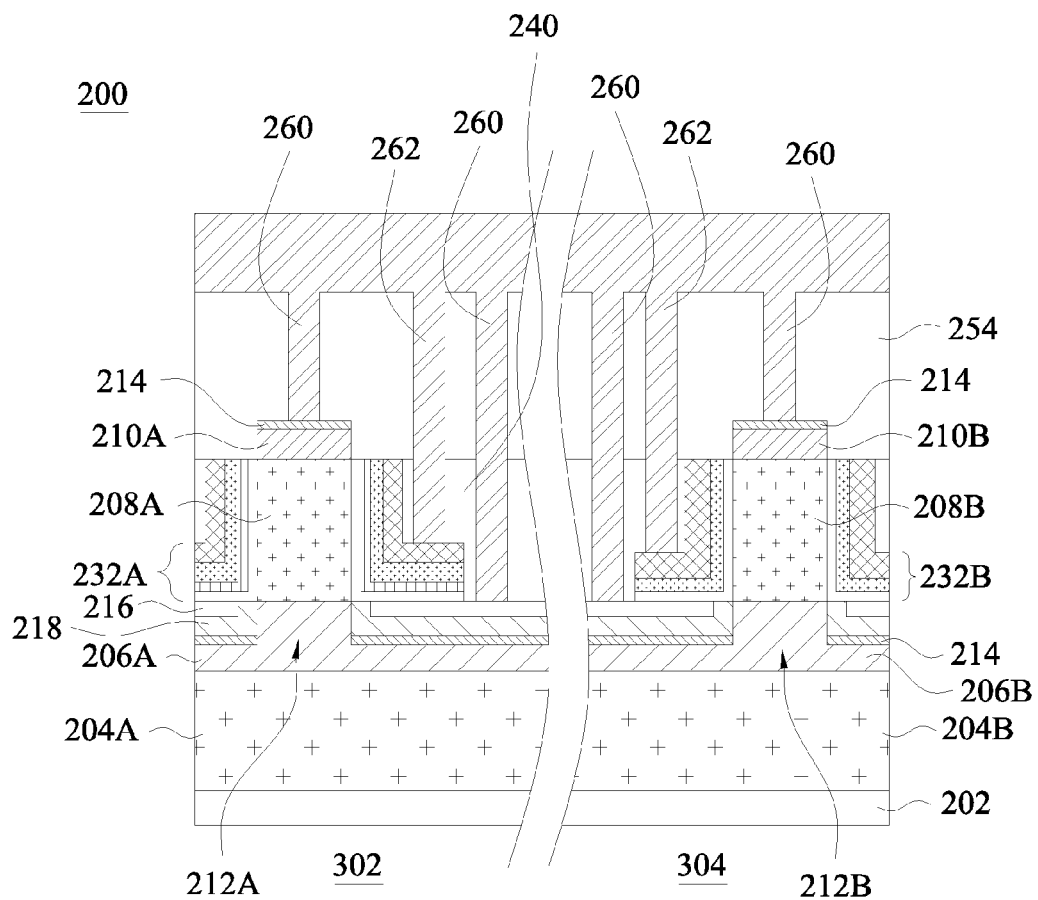
Figure 26:
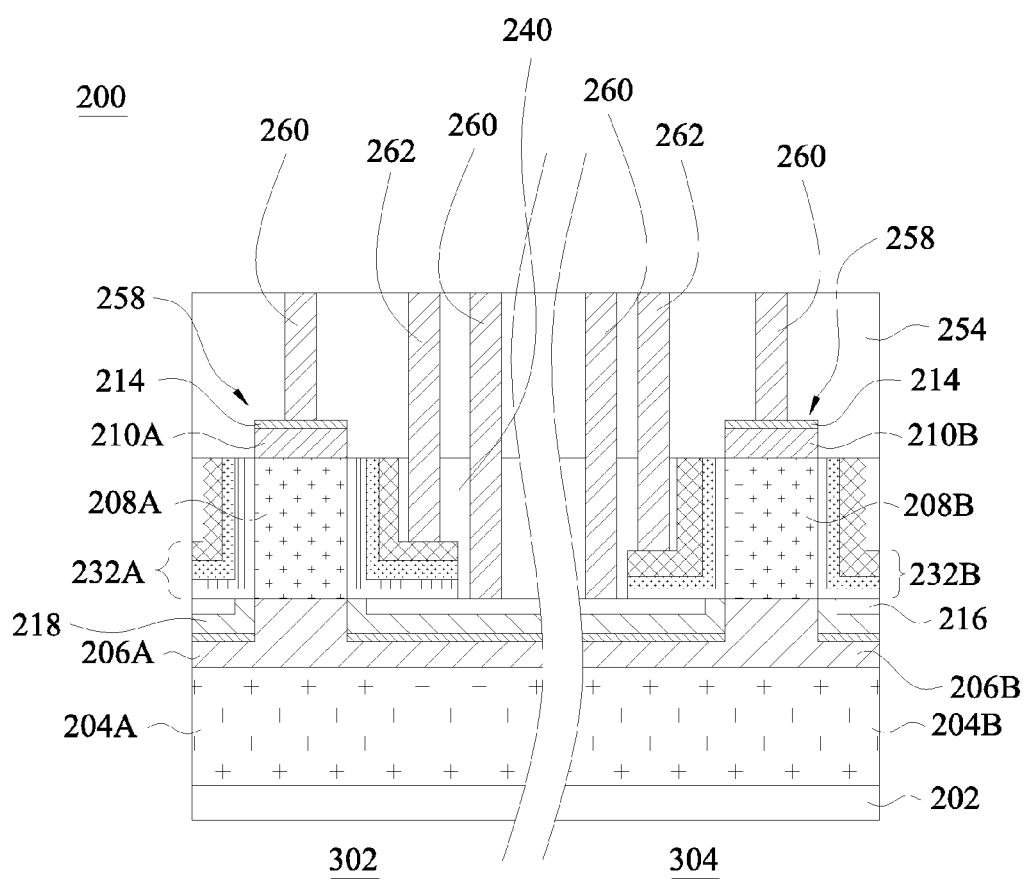

FIGS. 24 through 26 illustrate cross-sectional views of semiconductor device 200 at an intermediate stage of fabrication according to embodiments of process flow 100 of FIG. 1. Specifically, FIGS. 24 through 26 illustrate forming source/drain contacts (e.g., contacts 260) and gate contacts (e.g., contacts 262) extending through dielectric layers (e.g., dielectric layers 216, 240, and 254) according to step 114 of process flow 100. Referring first to FIG. 24, openings 256 are formed extending through CESL 218, dielectric layer 216, dielectric layer 240, and/or dielectric layer 254. Some openings 256 may expose portions of silicide regions 214, which provide electrical contacts to semiconductor regions 206A/206B and semiconductor regions 210A/210B. Other openings 256 may expose gate electrode portions of gate structures 232A/232B. Openings 256 may be patterned using any suitable process, such as a combination of photolithography and etching. In some embodiments, various hard mask layers may also be employed to etch dielectric layer 216, dielectric layer 240, dielectric layer 254, and CESL 218.

Next, as illustrated by FIGS. 25 and 26, openings 256 may be filled with a conductive material such as, tungsten, aluminum, copper, gold, silver, alloys thereof, combinations thereof, and the like to form source/drain contacts 260 electrically connected to salicide regions 214 and gate contacts 262 electrically connected to gate structures 232A/232B. The formation of contacts 260/262 may also include first depositing diffusion barrier layers and/or seed layers (not illustrated) on a bottom surface and sidewalls of openings 256. For example, the barrier layer may comprise titanium nitride, titanium oxide, tantalum nitride, tantalum oxide, and the like, and the barrier layer may be formed to reduce diffusion of the conductive material of contacts 260/262 into the surrounding dielectric material of dielectric layers 216, 240, and 254. The seed layer may also be formed prior to the formation of contacts 260/262, and forming contacts 260/262 may include an electroless plating process, an electro-chemical plating process, and the like using the seed layer. The formation of contacts 260/262 may overflow openings 256 as illustrated in FIG. 25, and a planarization process (e.g., CMP) may be performed to remove excess conductive material from device 200 as illustrated in FIG. 26. Thus, source/drain contacts 260 and gate contacts 262 may be formed extending through various dielectric layers to electrically connect to source/drain regions and gate electrodes of VGAA transistors 258.

Figure 27:
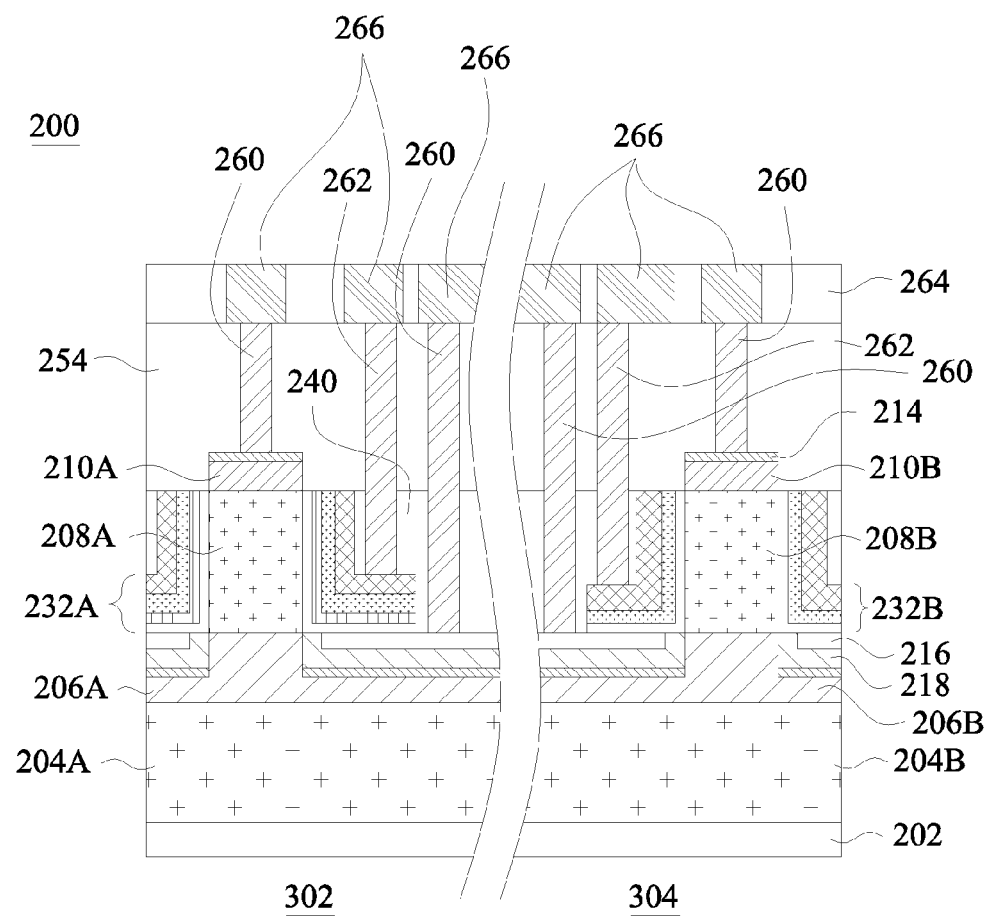

Subsequently, as illustrated in FIG. 27 additional dielectric layers, such as inter-metal dielectric (IMD) layer 264 may be formed over dielectric layer 254. IMD 264 may include conductive features formed therein, such as conductive features 266, which may comprise a conductive material such as copper, and the like. Conductive features 266 electrically connect to contacts 260/262 to additional interconnect structures and input/output features of device 200. Conductive features 266 may further include various metal lines and/or vias that may be used for electrical routing and to form functional circuits within device 200.

Thus, as described above, various embodiments include forming various CMP-stop layers and/or etch-stop layers within dielectric layers formed around nanowires of VGAA transistors. The CMP-stop layers and etch-stop layers provide improved process control for etching back dielectric layers to a desired height. The various CMP-stop layers and etch-stop layers may also improve the planarity of various dielectric layers. For example, dielectric layers may be used to separate a gate structure formed around a middle channel region from top and bottoms source/drain regions. By including the CMP-stop and/or etch-stop layers as described above, the dielectric layers can be etched to a target height (e.g., substantially level with surfaces source/drain regions) with improved process control. In such embodiments, gate structures may be formed for VGAA transistors with improved height uniformity control and improved nanowire device performance.

In accordance with an embodiment, a method includes forming a nanowire extending upwards from a substrate, wherein the nanowire includes: a bottom semiconductor region; a middle semiconductor region over the bottom semiconductor region; and a top semiconductor region over the middle semiconductor region. The method also includes forming a dielectric layer around and extending over the nanowire and forming a chemical mechanical polish-stop (CMP-stop) layer within the dielectric layer using an implantation process. After forming the CMP-stop layer, the dielectric layer is planarized.

In accordance with an embodiment, a method includes forming a dielectric layer around and extending above a nanowire, using a first implantation process to form a chemical mechanical polish-stop (CMP-stop) layer within the dielectric layer, and planarizing the dielectric layer to remove an upper portion of the dielectric layer over the CMP-stop layer. The method also includes using a second implantation process to form an etch-stop layer within the dielectric layer and applying an etching process so that a top surface of the dielectric layer is substantially level with a surface of at least one source/drain region of the nanowire.

In accordance with an embodiment, a method includes forming a first dielectric layer over and extending along sidewalls of a nanowire, wherein the nanowire includes: a bottom source/drain region; a channel region over the bottom source/drain region; and a top source/drain region over the channel region. The method also includes implanting a first chemical mechanical polish-stop (CMP-stop) layer within the first dielectric layer; after implanting the first CMP-stop layer, planarizing the first dielectric layer; and after planarizing the first dielectric layer, applying a first etching process so that a top surface of the first dielectric layer is substantially level with a top surface of the bottom source/drain region. The method also includes forming a gate structure around the channel region. The method also includes forming a second dielectric layer over the first dielectric layer and extending over the gate structure. The method also includes implanting a second CMP-stop layer within the second dielectric layer; after implanting the second CMP-stop layer, planarizing the second dielectric layer; and after planarizing the second dielectric layer, applying a second etching process so that a top surface of the second dielectric layer is substantially level with a top surface of the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a vertical gate all around (VGAA) transistor, the method comprising:
    forming a nanowire extending upwards from a substrate, wherein the nanowire comprises:
        a bottom semiconductor region;
        a middle semiconductor region over the bottom semiconductor region; and
        a top semiconductor region over the middle semiconductor region;
    forming a dielectric layer around and extending over the nanowire;
    forming a chemical mechanical polish-stop (CMP-stop) layer within the dielectric layer using an implantation process, wherein the implantation process changes an etching rate of a portion of the dielectric layer; and
    after forming the CMP-stop layer, planarizing the dielectric layer.

2. The method of claim 1, wherein the implantation process comprises implanting silicon, carbon, nitrogen, germanium, arsenic, argon, or a combination thereof in the dielectric layer.

3. The method of claim 2, wherein the implantation process comprises implanting silicon, carbon, nitrogen, germanium, arsenic, argon, or a combination thereof in the dielectric layer at a concentration of about $1\times10^{13}$ atoms/cm$^2$ to about $1\times10^{16}$ atoms/cm$^2$.

4. The method of claim 1, wherein the implantation process comprises controlling an implantation energy during the implantation process in accordance with a desired position and thickness of the CMP-stop layer within the dielectric layer.

5. The method of claim 4, wherein the implantation energy is about 0.1 KeV to about 350 KeV.

6. The method of claim 1 further comprising, prior to forming the CMP-stop layer, planarizing the dielectric layer.

7. The method of claim 1 further comprising after planarizing the dielectric layer, etching back the dielectric layer so that a top surface of the dielectric layer is substantially level with a top surface of the bottom semiconductor region or a top surface of the middle semiconductor region.

8. The method of claim 7, further comprising prior to etching back the dielectric layer, forming an etch-stop layer within the dielectric layer using an implantation process.

9. A method of forming a vertical gate all around (VGAA) transistor,
    the method comprising:
    forming a dielectric layer around and extending above a nanowire;
    using a first implantation process to form a chemical mechanical polish-stop (CMP-stop) layer within the dielectric layer;
    planarizing the dielectric layer to remove an upper portion of the dielectric layer over the CMP-stop layer;
    using a second implantation process to form an etch-stop layer within the dielectric layer; and applying an etching process so that a top surface of the dielectric layer is substantially level with a surface of at least one source/drain region of the nanowire.

10. The method of claim 9, wherein the second implantation process comprises decreasing an etching rate of an implanted portion of the dielectric layer during the etching process, wherein the implanted portion of the dielectric layer is the etch-stop layer.

11. The method of claim 10, wherein the second implantation process comprises implanting silicon, carbon, nitrogen, or a combination thereof in the implanted portion of the dielectric layer.

12. The method of claim 10, wherein after the second implantation process, an un-implanted portion of the dielectric layer is disposed over the etch-stop layer.

13. The method of claim 9, wherein the second implantation process comprises increasing an etching rate of an implanted portion the dielectric layer during the etching process, wherein an un-implanted portion of the dielectric layer is the etch-stop layer.

14. The method of claim 13, wherein the second implantation process comprises implanting argon, xenon, silicon, germanium, arsenic, phosphate, boron, or a combination thereof in the implanted portion of the dielectric layer.

15. The method of claim 9 further comprising planarizing the dielectric layer prior to forming the first implantation process.

16. A method of forming a vertical gate all around (VGAA) transistor, the method comprising:
    forming a first dielectric layer over and extending along sidewalls of a nanowire, wherein the nanowire comprises:
        a bottom source/drain region;
        a channel region over the bottom source/drain region; and
        a top source/drain region over the channel region;
    implanting a first chemical mechanical polish-stop (CMP-stop) layer within the first dielectric layer;
    after implanting the first CMP-stop layer, planarizing the first dielectric layer;
    after planarizing the first dielectric layer, applying a first etching process so that a top surface of the first dielectric layer is substantially level with a top surface of the bottom source/drain region;
    forming a gate structure around the channel region;
    forming a second dielectric layer over the first dielectric layer and extending over the gate structure;
    implanting a second CMP-stop layer within the second dielectric layer;
    after implanting the second CMP-stop layer, planarizing the second dielectric layer; and
    after planarizing the second dielectric layer, applying a second etching process so that a top surface of the second dielectric layer is substantially level with a top surface of the channel region.

17. The method of claim 16 further comprising prior to implanting the first CMP-stop layer, planarizing the first CMP-stop layer.

18. The method of claim 16 further comprising prior to the first etching process, implanting an etch-stop layer in the first dielectric layer, wherein the first etching process etches the first dielectric layer at a faster rate than the etch-stop layer.

19. The method of claim 16 further comprising prior to the first etching process, implanting an etching layer in the first dielectric layer, wherein the first etching process etches the first dielectric layer at a slower rate than the etching layer.

20. The method of claim 16 further comprising:
    after the second etching process, removing a portion of the gate structure extending over the second dielectric layer to expose the top source/drain region;
    forming a third dielectric layer around the top source/drain region;
    forming a first source/drain contact extending through the third dielectric layer and electrically connected to the top source/drain region;
    forming a gate contact extending through the second dielectric layer and the third dielectric layer and electrically connected to the gate structure; and
    forming a second source/drain contact extending through the first dielectric layer, the second dielectric layer, and the third dielectric layer and electrically connected to the bottom source/drain region.

* * * * *

UNITED STATES PATENT AND TRADEMARK OFFICE
CERTIFICATE OF CORRECTION

PATENT NO. : 9,502,265 B1
APPLICATION NO. : 14/932777
DATED : November 22, 2016
INVENTOR(S) : Ching-Hong Jiang It is certified that error appears in the above-identified patent and that said Letters Patent is hereby corrected as shown below:

In the Drawings

Please replace sheets 24 – 27 as follows:

Signed and Sealed this
Fourth Day of April, 2017

Michelle K. Lee
*Director of the United States Patent and Trademark Office*